(12) United States Patent
Yuan et al.

(10) Patent No.: US 10,295,147 B2
(45) Date of Patent: *May 21, 2019

(54) LED ARRAY AND METHOD FOR FABRICATING SAME

(75) Inventors: Thomas Cheng-Hsin Yuan, Ventura, CA (US); Bernd Keller, Santa Barbara, CA (US)

(73) Assignee: CREE, INC., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/982,276

(22) Filed: Oct. 31, 2007

(65) Prior Publication Data

US 2008/0170396 A1   Jul. 17, 2008

Related U.S. Application Data

(63) Continuation-in-part of application No. 11/595,720, filed on Nov. 9, 2006, now Pat. No. 7,897,980.

(51) Int. Cl.
*F21V 5/00* (2018.01)
*F21K 9/00* (2016.01)
(Continued)

(52) U.S. Cl.
CPC ............... *F21V 5/007* (2013.01); *F21K 9/00* (2013.01); *F21S 2/005* (2013.01); *F21V 5/04* (2013.01);
(Continued)

(58) Field of Classification Search
CPC ........... F21Y 2105/001; F21Y 2101/02; F21Y 2113/00; F21Y 2105/10; F21Y 2115/10;
(Continued)

(56) References Cited

U.S. PATENT DOCUMENTS 3,674,990 A    7/1972   Kurauchi et al. ........ 235/462.16
3,875,456 A *  4/1975   Kano et al. .................... 313/501
(Continued)

FOREIGN PATENT DOCUMENTS

CH    101271674    12/2010
CN    1406450 A    3/2003
(Continued)

OTHER PUBLICATIONS

U.S. Appl. No. 11/656,759, filed Jan. 22, 2007, Wafer Level Phosphor Coating Method and Devices Fabricated Utilizing Method.
(Continued)

*Primary Examiner* — Hargobind S Sawhney
(74) *Attorney, Agent, or Firm* — Koppel, Patrick, Heybl & Philpott

(57) ABSTRACT

A light emitting device or array comprising a submount having a top surface, a bottom surface and a plurality of edges, with input and output terminals disposed on the top surface. A plurality of attach pads and traces are also disposed on the top surface and electrically connected between the input and output terminals. A plurality of LEDs are also included, each of which is mounted to one of the attach pads. The attach pads cover more of the top surface than the LEDs and spread heat from the LEDs to the top surface of the submount. A plurality of lenses are also included each of which is molded over a respective one of the attach pads and covers the LED mounted to the particular attach pad. The arrays are shaped and arranged so that they can be easily attached to similar arrays in a tiling fashion, with the desired number of arrays included to meet the desired lighting requirements. Methods for fabricating the arrays from a single submount or submounts panel are also disclosed.

52 Claims, 7 Drawing Sheets

(51) Int. Cl.
  *F21S 2/00* (2016.01)
  *F21Y 113/00* (2016.01)
  *H01L 25/075* (2006.01)
  *H01L 33/62* (2010.01)
  *F21V 5/04* (2006.01)
  *F21Y 105/10* (2016.01)
  *F21Y 115/10* (2016.01)
  *F21Y 107/40* (2016.01)

(52) U.S. Cl.
  CPC ....... *F21Y 2105/10* (2016.08); *F21Y 2107/40* (2016.08); *F21Y 2113/00* (2013.01); *F21Y 2115/10* (2016.08); *H01L 25/0753* (2013.01); *H01L 33/62* (2013.01); *H01L 2924/0002* (2013.01)

(58) Field of Classification Search
  CPC .... F21Y 2103/10; F21Y 2105/00; F21K 9/00; F21V 5/007; F21V 29/004; F21V 5/04; F21V 5/008; F21V 19/0025; H05K 1/021; H05K 1/01; H05K 2201/10106; H01L 33/486; H01L 25/0753; H01L 24/05; H01L 33/62; H01L 33/64; H01L 33/644; H01L 2224/48227; H01L 2224/48247; H01L 23/142; H01L 33/507; H01L 33/642; H01L 33/647; H01L 2224/05553; H01L 2224/05554; H01L 2224/4911; H01L 2224/48137; H01L 33/08; H01L 2224/05555; F21S 2/005; G02B 3/00
  USPC .......... 257/88, 83, E21.03, E23.01, E25.02, 257/25.032, 79, 91–100, 465, 601; 362/800, 368, 373, 227, 236, 252, 640, 362/647, 657–659, 235, 238, 249.01, 362/249.02, 249.14, 294, 308, 545, 547; 345/1.1, 1.3
  See application file for complete search history.

(56) References Cited

U.S. PATENT DOCUMENTS

| | | | |
|---|---|---|---|
| 3,900,863 A | 8/1975 | Kim | 257/95 |
| 4,322,735 A * | 3/1982 | Sadamasa et al. | 257/89 |
| 4,500,914 A | 2/1985 | Watanabe et al. | 348/280 |
| 4,733,335 A | 3/1988 | Serizawa et al. | 362/503 |
| 4,918,497 A | 4/1990 | Edmond | 357/17 |
| 4,935,665 A | 6/1990 | Murata | 313/500 |
| 4,946,547 A | 8/1990 | Palmour et al. | 156/643 |
| 4,966,862 A | 10/1990 | Edmond | 437/100 |
| 4,992,704 A | 2/1991 | Stinson | 315/312 |
| 5,027,168 A | 6/1991 | Edmond | 357/17 |
| 5,184,114 A | 2/1993 | Brown | 345/83 |
| 5,200,022 A | 4/1993 | Kong et al. | 156/612 |
| 5,210,051 A | 5/1993 | Carter, Jr. | 437/107 |
| 5,277,840 A | 1/1994 | Osaka et al. | 252/301.36 |
| 5,278,432 A | 1/1994 | Ignatius et al. | 257/88 |
| 5,338,944 A | 8/1994 | Edmond et al. | 257/76 |
| RE34,861 E | 2/1995 | Davis et al. | 437/100 |
| 5,393,993 A | 2/1995 | Edmond et al. | 257/77 |
| 5,416,342 A | 5/1995 | Edmond et al. | 257/76 |
| 5,453,405 A | 9/1995 | Fan et al. | 438/34 |
| 5,523,589 A | 6/1996 | Edmond et al. | 257/77 |
| 5,604,135 A | 2/1997 | Edmond et al. | 437/22 |
| 5,614,131 A | 3/1997 | Mukerji et al. | 264/1.9 |
| 5,631,190 A | 5/1997 | Negley | 438/33 |
| 5,643,834 A * | 7/1997 | Harada et al. | 438/122 |
| 5,739,554 A | 4/1998 | Edmond et al. | 257/103 |
| 5,766,987 A | 6/1998 | Mitchell et al. | 438/126 |
| 5,813,753 A | 9/1998 | Vriens | 362/293 |
| 5,858,278 A | 1/1999 | Itoh et al. | 252/301.4 R |
| 5,912,477 A | 6/1999 | Negley | 257/95 |
| 5,923,053 A | 7/1999 | Jakowetz et al. | 257/95 |
| 5,946,022 A | 8/1999 | Kamimura | 347/238 |
| 5,959,316 A | 9/1999 | Lowery | 257/98 |
| 5,988,925 A | 11/1999 | Baggett | 313/503 |
| 5,990,497 A | 11/1999 | Kamakura et al. | |
| 6,001,671 A | 12/1999 | Fjelstad | 438/112 |
| 6,066,861 A | 5/2000 | Horn et al. | 257/99 |
| 6,069,440 A | 5/2000 | Shimizu et al. | 313/486 |
| 6,087,202 A | 7/2000 | Exposito et al. | 438/113 |
| 6,093,940 A * | 7/2000 | Ishinaga et al. | 257/99 |
| 6,120,600 A | 9/2000 | Edmond et al. | 117/89 |
| 6,132,072 A | 10/2000 | Turnbull et al. | 362/494 |
| 6,139,304 A | 10/2000 | Centofante | 425/121 |
| 6,153,448 A | 11/2000 | Takahashi et al. | 438/114 |
| 6,187,606 B1 | 2/2001 | Edmond et al. | 438/46 |
| 6,201,262 B1 | 3/2001 | Edmond et al. | 257/77 |
| 6,252,254 B1 | 6/2001 | Soules et al. | 257/89 |
| 6,297,598 B1 * | 10/2001 | Wang et al. | 315/169.3 |
| 6,329,224 B1 | 12/2001 | Nguyen et al. | 438/127 |
| 6,331,063 B1 | 12/2001 | Kamada et al. | 362/237 |
| 6,338,813 B1 | 1/2002 | Hsu et al. | 264/272.14 |
| 6,376,277 B2 | 4/2002 | Corisis | 438/106 |
| 6,404,125 B1 | 6/2002 | Garbuzou | 313/499 |
| 6,422,716 B2 * | 7/2002 | Henrici et al. | 362/235 |
| 6,476,410 B2 * | 11/2002 | Ishinaga | 257/13 |
| 6,501,084 B1 * | 12/2002 | Sakai et al. | 250/504 R |
| 6,501,100 B1 | 12/2002 | Srivastava | |
| 6,522,065 B1 | 2/2003 | Srivastava | |
| 6,531,328 B1 | 3/2003 | Chen | 438/26 |
| 6,573,537 B1 * | 6/2003 | Steigerwald et al. | 257/103 |
| 6,577,073 B2 | 6/2003 | Shimizu et al. | |
| 6,583,444 B2 | 6/2003 | Fjelstad | 257/82 |
| 6,590,152 B1 * | 7/2003 | Horio | H01L 31/0203 174/354 |
| 6,617,795 B2 | 9/2003 | Bruning | 315/151 |
| 6,624,058 B2 | 9/2003 | Kazama | 438/612 |
| 6,642,652 B2 | 11/2003 | Collins, III | 313/512 |
| 6,653,765 B1 | 11/2003 | Levinson | 313/112 |
| 6,661,029 B1 | 12/2003 | Duggal | 257/89 |
| 6,682,331 B1 * | 1/2004 | Peh et al. | 425/112 |
| 6,733,711 B2 | 5/2004 | Durocher et al. | 264/272.14 |
| 6,739,735 B2 * | 5/2004 | Talamo et al. | 362/237 |
| 6,759,266 B1 | 7/2004 | Hoffman | 438/64 |
| 6,791,119 B2 | 9/2004 | Slater, Jr. et al. | 257/99 |
| 6,791,259 B1 | 9/2004 | Stokes | |
| 6,793,371 B2 | 9/2004 | Lamke et al. | 362/241 |
| 6,812,500 B2 | 11/2004 | Reeh et al. | 257/98 |
| 6,853,010 B2 | 2/2005 | Slater, Jr. et al. | 257/98 |
| 6,860,621 B2 * | 3/2005 | Bachl et al. | 362/373 |
| 6,890,107 B2 * | 5/2005 | Brophy et al. | 385/88 |
| 6,891,200 B2 * | 5/2005 | Nagai et al. | 257/88 |
| 6,909,123 B2 | 6/2005 | Hayashimoto et al. | 257/98 |
| 6,919,683 B1 | 7/2005 | Jang | 313/503 |
| 6,939,481 B2 | 9/2005 | Srivastava | |
| 6,948,825 B2 | 9/2005 | Christoph | 362/33 |
| 6,958,497 B2 | 10/2005 | Emerson et al. | 257/94 |
| 7,002,546 B1 | 2/2006 | Stuppi et al. | 345/102 |
| 7,008,080 B2 * | 3/2006 | Bachl et al. | 362/237 |
| 7,015,512 B2 * | 3/2006 | Park et al. | 257/99 |
| 7,023,019 B2 | 4/2006 | Maeda et al. | 257/89 |
| 7,029,935 B2 | 4/2006 | Negley et al. | |
| 7,049,159 B2 | 5/2006 | Lowery | 438/22 |
| 7,055,987 B2 * | 6/2006 | Staufert | 362/235 |
| 7,095,053 B2 | 8/2006 | Mazzochette et al. | 257/81 |
| 7,176,503 B2 | 2/2007 | Kim et al. | 257/100 |
| 7,183,587 B2 | 2/2007 | Negley et al. | 257/99 |
| 7,202,598 B2 | 4/2007 | Juestel et al. | 313/503 |
| 7,204,607 B2 | 4/2007 | Yano et al. | 362/231 |
| 7,213,940 B1 | 5/2007 | Van de Ven et al. | |
| 7,252,408 B2 | 8/2007 | Mazzochette et al. | 362/294 |
| 7,259,400 B1 | 8/2007 | Taskar | 257/98 |
| 7,262,437 B2 * | 8/2007 | Bogner et al. | 257/95 |
| 7,278,755 B2 * | 10/2007 | Inamoto | 362/240 |
| 7,286,296 B2 | 10/2007 | Chaves et al. | 359/641 |
| 7,355,562 B2 * | 4/2008 | Schubert et al. | 345/1.3 |
| 7,381,995 B2 | 6/2008 | Tain et al. | |
| 7,387,421 B2 | 6/2008 | Lee et al. | 362/612 |
| 7,439,549 B2 * | 10/2008 | Marchl et al. | 257/88 |
| 7,478,922 B2 | 1/2009 | Garbus, Jr. | 362/231 |
| 7,528,421 B2 | 5/2009 | Mazzochette | 257/99 |

(56) References Cited

U.S. PATENT DOCUMENTS

| | | |
|---|---|---|
| 7,601,550 B2 | 10/2009 | Bogner |
| 7,605,452 B2 | 10/2009 | Yamanaka et al. ............ 257/676 |
| 7,621,655 B2 | 11/2009 | Roberts et al. .......... 362/249.02 |
| 7,665,861 B2* | 2/2010 | Blumel et al. ............ 362/249.02 |
| 7,700,964 B2 | 4/2010 | Morimoto et al. ............. 257/98 |
| 7,723,744 B2 | 5/2010 | Gillies et al. ................. 257/98 |
| 7,772,609 B2 | 8/2010 | Yan |
| 7,821,023 B2 | 10/2010 | Yuan et al. .................... 257/98 |
| 7,829,899 B2 | 11/2010 | Hutchins ........................ 257/79 |
| 7,897,980 B2 | 3/2011 | Yuan et al. .................... 257/88 |
| 7,902,560 B2 | 3/2011 | Bierhuizen et al. ............. 257/82 |
| 7,993,036 B2 | 8/2011 | Holder .................... 362/311.02 |
| 8,022,626 B2 | 9/2011 | Hamby et al. ................ 313/512 |
| 8,035,603 B2 | 10/2011 | Furukawa et al. ............ 345/102 |
| 8,098,364 B2 | 1/2012 | Yu et al. ......................... 355/55 |
| 8,272,757 B1* | 9/2012 | Fan .................... H01L 25/0753 |
| | | 257/778 |
| 8,511,855 B2 | 8/2013 | Marchl et al. |
| 2001/0032985 A1 | 10/2001 | Bhat ............................... 257/88 |
| 2001/0033726 A1 | 10/2001 | Shie et al. .................... 365/133 |
| 2002/0001193 A1 | 1/2002 | Osawa |
| 2002/0001869 A1 | 1/2002 | Fjelstad |
| 2002/0006040 A1 | 1/2002 | Kamada et al. |
| 2002/0029071 A1 | 3/2002 | Whitehurst |
| 2002/0057057 A1 | 5/2002 | Sorg |
| 2002/0070449 A1 | 6/2002 | Yagi et al. |
| 2002/0070681 A1 | 6/2002 | Shimizu et al. .............. 315/246 |
| 2002/0079837 A1 | 6/2002 | Okazaki |
| 2002/0093820 A1 | 7/2002 | Pederson |
| 2002/0096789 A1 | 7/2002 | Bolken |
| 2002/0105266 A1 | 8/2002 | Juestel et al. |
| 2002/0113246 A1 | 8/2002 | Nagal et al. |
| 2002/0123164 A1 | 9/2002 | Slater, Jr. et al. |
| 2002/0185965 A1 | 12/2002 | Collins, III et al. |
| 2002/0195935 A1 | 12/2002 | Jager et al. |
| 2003/0006418 A1 | 1/2003 | Emerson et al. |
| 2003/0038596 A1 | 2/2003 | Ho |
| 2003/0053310 A1 | 3/2003 | Sommers |
| 2003/0058641 A1 | 3/2003 | Watanabe |
| 2003/0066311 A1 | 4/2003 | Li et al. |
| 2003/0072153 A1 | 4/2003 | Matsui et al. |
| 2003/0116769 A1 | 6/2003 | Song et al. |
| 2003/0121511 A1 | 7/2003 | Hashimura et al. |
| 2003/0142712 A1* | 7/2003 | Ikeda et al. .................... 372/36 |
| 2003/0147055 A1 | 8/2003 | Yokoyama |
| 2003/0160258 A1 | 8/2003 | Oohata |
| 2003/0171150 A1 | 9/2003 | Oki et al. ........................ 463/51 |
| 2003/0189829 A1 | 10/2003 | Shimizu et al. .............. 362/240 |
| 2003/0207500 A1 | 11/2003 | Pichler et al. |
| 2004/0004435 A1 | 1/2004 | Hsu |
| 2004/0012958 A1 | 1/2004 | Hashimoto et al. |
| 2004/0026706 A1 | 2/2004 | Bogner et al. .................. 257/99 |
| 2004/0037076 A1 | 2/2004 | Katoh ........................... 362/235 |
| 2004/0037949 A1 | 2/2004 | Wright |
| 2004/0038442 A1 | 2/2004 | Kinsman |
| 2004/0041159 A1 | 3/2004 | Yuri et al. |
| 2004/0041222 A1 | 3/2004 | Loh |
| 2004/0056260 A1 | 3/2004 | Slater, Jr. et al. |
| 2004/0079957 A1 | 4/2004 | Andrews |
| 2004/0080939 A1 | 4/2004 | Braddell et al. |
| 2004/0089939 A1* | 5/2004 | Ogihara .................... B41J 2/45 |
| | | 257/690 |
| 2004/0099874 A1* | 5/2004 | Chang et al. ................... 257/98 |
| 2004/0104391 A1 | 6/2004 | Maeda et al. ................... 257/79 |
| 2004/0106234 A1 | 6/2004 | Sorg et al. |
| 2004/0135522 A1 | 7/2004 | Berman et al. |
| 2004/0164307 A1 | 8/2004 | Mueller-Mach et al. |
| 2004/0173806 A1 | 9/2004 | Chua |
| 2004/0184272 A1* | 9/2004 | Wright et al. ................ 362/373 |
| 2004/0188696 A1 | 9/2004 | Hsing Chen .................... 257/99 |
| 2004/0222433 A1 | 11/2004 | Mazzochette et al. |
| 2004/0239242 A1 | 12/2004 | Mano et al. |
| 2004/0245532 A1 | 12/2004 | Maeda et al. ................... 257/89 |
| 2004/0256626 A1 | 12/2004 | Wang |
| 2004/0264193 A1 | 12/2004 | Okumura |
| 2005/0002168 A1 | 1/2005 | Narhi et al. |
| 2005/0006651 A1 | 1/2005 | LeBoeuf et al. |
| 2005/0051782 A1 | 3/2005 | Negley et al. |
| 2005/0057929 A1 | 3/2005 | Yano et al. ................... 362/240 |
| 2005/0072981 A1 | 4/2005 | Suenaga |
| 2005/0073840 A1 | 4/2005 | Chou et al. |
| 2005/0082475 A1 | 4/2005 | Doan ........................... 250/307 |
| 2005/0093004 A1 | 5/2005 | Yoo |
| 2005/0093422 A1 | 5/2005 | Wang |
| 2005/0093430 A1 | 5/2005 | Ibbetson et al. .............. 313/501 |
| 2005/0117352 A1* | 6/2005 | Lin .......................... F21K 9/00 |
| | | 362/374 |
| 2005/0122018 A1 | 6/2005 | Morris ............................ 313/46 |
| 2005/0122031 A1 | 6/2005 | Itai et al. |
| 2005/0141584 A1 | 6/2005 | Ohe et al. ..................... 372/108 |
| 2005/0179041 A1 | 8/2005 | Harbers et al. ................. 257/80 |
| 2005/0196886 A1 | 9/2005 | Jager et al. |
| 2005/0211991 A1 | 9/2005 | Mori et al. |
| 2005/0221519 A1 | 10/2005 | Leung et al. |
| 2005/0225976 A1 | 10/2005 | Zampini et al. |
| 2005/0247944 A1 | 11/2005 | Haque ............................ 257/79 |
| 2005/0253151 A1 | 11/2005 | Sakai et al. |
| 2005/0265404 A1 | 12/2005 | Ashdown |
| 2005/0276053 A1 | 12/2005 | Nortrup et al. ............... 362/294 |
| 2005/0280894 A1 | 12/2005 | Hartkop et al. |
| 2005/0286264 A1 | 12/2005 | Kim |
| 2006/0001046 A1 | 1/2006 | Batres et al. |
| 2006/0006406 A1 | 1/2006 | Kim et al. ..................... 257/100 |
| 2006/0017402 A1 | 1/2006 | McKinney et al. |
| 2006/0039143 A1 | 2/2006 | Katoh et al. .................. 362/244 |
| 2006/0049782 A1 | 3/2006 | Vornsand et al. |
| 2006/0091788 A1 | 5/2006 | Yan |
| 2006/0102914 A1 | 5/2006 | Smits et al. .................... 257/98 |
| 2006/0105478 A1 | 5/2006 | Camras et al. ................. 438/22 |
| 2006/0105484 A1 | 5/2006 | Basin |
| 2006/0139580 A1 | 6/2006 | Conner ........................... 353/98 |
| 2006/0157721 A1 | 7/2006 | Tran et al. |
| 2006/0163589 A1 | 7/2006 | Fan et al. ....................... 257/88 |
| 2006/0180818 A1 | 8/2006 | Nagai et al. |
| 2006/0258028 A1 | 11/2006 | Paolini et al. .................. 438/22 |
| 2006/0289878 A1 | 12/2006 | Brunner et al. ................. 257/89 |
| 2007/0012940 A1 | 1/2007 | Suh et al. |
| 2007/0013057 A1 | 1/2007 | Mazzochette |
| 2007/0030676 A1 | 2/2007 | Ichihara et al. |
| 2007/0096131 A1 | 5/2007 | Chandra |
| 2007/0109779 A1 | 5/2007 | Sekiguchi et al. |
| 2007/0115670 A1 | 5/2007 | Roberts et al. |
| 2007/0139920 A1 | 6/2007 | Van De Ven et al. |
| 2007/0158669 A1 | 7/2007 | Lee et al. |
| 2007/0165403 A1 | 7/2007 | Park |
| 2007/0223219 A1 | 9/2007 | Medendorp |
| 2007/0247414 A1 | 10/2007 | Roberts ......................... 345/102 |
| 2007/0247855 A1 | 10/2007 | Yano |
| 2007/0252924 A1 | 11/2007 | Haga et al. ..................... 349/68 |
| 2007/0257272 A1 | 11/2007 | Hutchins ........................ 257/98 |
| 2007/0278934 A1 | 12/2007 | Van de Ven et al. |
| 2007/0291467 A1 | 12/2007 | Nagai et al. ..................... 362/84 |
| 2007/0295972 A1 | 12/2007 | Tsai et al. |
| 2007/0295975 A1 | 12/2007 | Omae ............................ 257/89 |
| 2008/0006815 A1 | 1/2008 | Wang et al. |
| 2008/0024696 A1 | 1/2008 | Arai et al. ....................... 349/62 |
| 2008/0043444 A1 | 2/2008 | Hasegawa .................... 361/717 |
| 2008/0100774 A1 | 5/2008 | Jeon et al. |
| 2008/0106895 A1 | 5/2008 | Van De Ven et al. ........ 362/231 |
| 2008/0112164 A1 | 5/2008 | Teshirogi ...................... 362/231 |
| 2008/0128735 A1 | 6/2008 | Yoo |
| 2008/0130285 A1 | 6/2008 | Negley et al. |
| 2008/0137357 A1 | 6/2008 | Friedrichs et al. |
| 2008/0142816 A1 | 6/2008 | Bierhuizen et al. ............. 257/82 |
| 2008/0151527 A1 | 6/2008 | Ueno |
| 2008/0170396 A1 | 7/2008 | Yuan et al. .................... 362/244 |
| 2008/0173884 A1 | 7/2008 | Chitnis et al. |
| 2008/0174996 A1 | 7/2008 | Lu .................................. 362/235 |
| 2008/0203410 A1 | 8/2008 | Brunner et al. |
| 2008/0203415 A1 | 8/2008 | Thompson et al. |
| 2008/0204366 A1 | 8/2008 | Kane et al. ...................... 345/44 |
| 2008/0225520 A1 | 9/2008 | Garbus ......................... 362/231 |
| 2008/0232079 A1 | 9/2008 | Awazu ............................. 362/3 |
| 2008/0238335 A1 | 10/2008 | Lee |

(56) References Cited

U.S. PATENT DOCUMENTS

| | | | |
|---|---|---|---|
| 2008/0239722 A1 | 10/2008 | Wilcox | 362/268 |
| 2008/0278655 A1 | 11/2008 | Moon | 349/58 |
| 2008/0285268 A1 | 11/2008 | Oku et al. | 362/231 |
| 2008/0296589 A1* | 12/2008 | Speier et al. | 257/82 |
| 2009/0008662 A1 | 1/2009 | Ashdown et al. | |
| 2009/0050907 A1 | 2/2009 | Yuan et al. | |
| 2009/0050908 A1 | 2/2009 | Yuan | 257/88 |
| 2009/0160363 A1 | 6/2009 | Negley | |
| 2009/0195189 A1 | 8/2009 | Zampini et al. | |
| 2009/0201679 A1 | 8/2009 | Konaka | 362/235 |
| 2009/0212717 A1 | 8/2009 | Trattler | 315/297 |
| 2009/0231832 A1 | 9/2009 | Zukauskas et al. | 362/84 |
| 2009/0257240 A1 | 10/2009 | Koike | 362/538 |
| 2009/0316073 A1 | 12/2009 | Chen et al. | 349/64 |
| 2010/0014290 A1 | 1/2010 | Wilcox | 362/244 |
| 2010/0025700 A1 | 2/2010 | Jung et al. | 257/89 |
| 2010/0046231 A1 | 2/2010 | Medinis | 362/294 |
| 2010/0079059 A1 | 4/2010 | Roberts et al. | |
| 2010/0149783 A1 | 6/2010 | Takenaka et al. | 362/84 |
| 2010/0302786 A1 | 12/2010 | Wilcox | 362/327 |
| 2011/0001149 A1 | 1/2011 | Chan et al. | |
| 2011/0037084 A1 | 2/2011 | Sekii | 257/89 |
| 2011/0075428 A1 | 3/2011 | Chen | 362/311.02 |
| 2011/0095311 A1 | 4/2011 | Marchl et al. | |
| 2011/0164425 A1 | 7/2011 | Chen | 362/311.06 |
| 2011/0222280 A1 | 9/2011 | Kim | 362/235 |
| 2011/0242807 A1 | 10/2011 | Little, Jr. | 362/235 |
| 2012/0075858 A1 | 3/2012 | Hsieh | 362/249.02 |
| 2012/0104426 A1 | 5/2012 | Chan | |
| 2012/0134154 A1 | 5/2012 | Marchl et al. | |
| 2013/0142712 A1 | 6/2013 | Nagayasu et al. | 372/36 |

FOREIGN PATENT DOCUMENTS

| | | |
|---|---|---|
| CN | 1460393 | 12/2003 |
| CN | 1470072 | 1/2004 |
| CN | 1470072 A | 1/2004 |
| CN | 1512601 A | 7/2004 |
| CN | 1641899 A | 7/2005 |
| CN | 1667845 A | 9/2005 |
| CN | 1910762 A | 2/2007 |
| CN | 1983590 A | 6/2007 |
| CN | 101217840 | 7/2008 |
| CN | 101253813 | 8/2008 |
| CN | 201119078 | 9/2008 |
| CN | 101288341 | 10/2008 |
| DE | 2315709 | 3/1973 |
| DE | 19848078 | 4/2000 |
| DE | 10353293 A1 | 6/2005 |
| DE | 102005059362 | 9/2006 |
| DE | 102005028403 | 12/2006 |
| DE | 102005062514 | 3/2007 |
| EP | 0594427 A2 * | 4/1994 ............ H05K 1/181 |
| EP | 0732740 A2 | 9/1996 |
| EP | 1059678 | 12/2000 |
| EP | 1138747 | 10/2001 |
| EP | 1198016 A2 | 4/2002 |
| EP | 1367655 | 12/2003 |
| EP | 1385215 A2 | 1/2004 |
| EP | 1724848 A | 11/2006 |
| EP | 1724848 A2 | 11/2006 |
| EP | 2337072 A2 | 6/2011 |
| EP | 2337072 A2 | 6/2011 |
| EP | 2341280 A2 | 6/2011 |
| FR | 2704690 | 11/1994 |
| FR | 2704690 A | 11/1994 |
| JP | 6284942 | 5/1987 |
| JP | 03209781 | 9/1991 |
| JP | 0545812 | 6/1993 |
| JP | 09246602 | 9/1997 |
| JP | 10012915 | 1/1998 |
| JP | 10261821 | 9/1998 |
| JP | 2000002802 | 1/2000 |
| JP | 2000208820 A | 7/2000 |
| JP | 2001000043 | 1/2001 |
| JP | 2001057446 | 2/2001 |
| JP | 2001351404 | 12/2001 |
| JP | 2002009097 A | 1/2002 |
| JP | 2002-50799 A | 2/2002 |
| JP | 2002-050799 A | 2/2002 |
| JP | 2002-076446 | 3/2002 |
| JP | 2002184207 | 6/2002 |
| JP | 2002184207 A | 6/2002 |
| JP | 2002-531955 | 9/2002 |
| JP | 2002-531956 | 9/2002 |
| JP | 2003-168305 | 6/2003 |
| JP | 2003-170465 | 6/2003 |
| JP | 2003168305 | 6/2003 |
| JP | 2003168305 A | 6/2003 |
| JP | 2003-526212 | 9/2003 |
| JP | 2003-318448 | 11/2003 |
| JP | 2003-533852 | 11/2003 |
| JP | 2004-501512 | 1/2004 |
| JP | 2004095580 | 3/2004 |
| JP | 2004512687 | 4/2004 |
| JP | 2004266168 | 9/2004 |
| JP | 2005033138 A | 2/2005 |
| JP | 2005142311 | 6/2005 |
| JP | 2005158957 | 6/2005 |
| JP | 2005-228695 | 8/2005 |
| JP | 2005228695 | 8/2005 |
| JP | 2005228695 A | 8/2005 |
| JP | 2005298817 | 10/2005 |
| JP | 2006019598 | 1/2006 |
| JP | 2006054209 | 2/2006 |
| JP | 2006054329 | 2/2006 |
| JP | 2006054329 A | 2/2006 |
| JP | 2006114854 | 4/2006 |
| JP | 2006-128512 | 5/2006 |
| JP | 2006128512 | 5/2006 |
| JP | 2006173271 | 6/2006 |
| JP | 2006261039 | 9/2006 |
| JP | 2006261375 | 9/2006 |
| JP | 2006294898 | 10/2006 |
| JP | 2006344690 | 12/2006 |
| JP | 2007049172 | 2/2007 |
| JP | 200759260 | 3/2007 |
| JP | 2007059207 | 3/2007 |
| JP | 2007067103 | 3/2007 |
| JP | 2007112134 | 5/2007 |
| JP | 2007189239 | 7/2007 |
| JP | 2007519221 | 7/2007 |
| JP | 2007227679 | 9/2007 |
| JP | 2007251214 | 9/2007 |
| JP | 2007529105 | 10/2007 |
| JP | 2007324608 | 12/2007 |
| JP | 200810691 | 1/2008 |
| JP | 200828171 | 2/2008 |
| JP | 2008505433 | 2/2008 |
| JP | 2008123818 | 5/2008 |
| JP | 2008218486 | 9/2008 |
| JP | 2008252262 | 10/2008 |
| JP | 2010511978 | 4/2010 |
| JP | 2011521469 | 7/2011 |
| TW | 540163 | 7/2003 |
| TW | 540163 B | 7/2003 |
| TW | 200525775 | 8/2005 |
| TW | 200633265 | 9/2006 |
| TW | 200620718 | 10/2007 |
| TW | 200827618 | 7/2008 |
| TW | 1404226 | 8/2013 |
| WO | WO 00/33390 | 6/2000 |
| WO | WO0124283 A | 4/2001 |
| WO | WO0124283 A1 | 4/2001 |
| WO | WO 02/33756 A1 | 4/2002 |
| WO | WO 02/097884 A1 | 12/2002 |
| WO | WO 02097884 A1 | 12/2002 |
| WO | WO 03/021668 A1 | 3/2003 |
| WO | WO 03019072 | 3/2003 |
| WO | WO 03021691 A1 | 3/2003 |
| WO | WO 2005013365 A2 | 2/2005 |
| WO | WO 2005101909 | 10/2005 |
| WO | WO 2006/001221 A1 | 1/2006 |
| WO | WO 2006001221 | 1/2006 |

(56) References Cited

FOREIGN PATENT DOCUMENTS

| | | |
|---|---|---|
| WO | WO 2006013800 | 2/2006 |
| WO | WO 2006016326 | 2/2006 |
| WO | WO 2006033695 A2 | 3/2006 |
| WO | WO 2006036251 A1 | 4/2006 |
| WO | WO 2006/068297 | 6/2006 |
| WO | WO 2006/068297 A1 | 6/2006 |
| WO | WO 2006068297 | 6/2006 |
| WO | WO 2006068297 A1 | 6/2006 |
| WO | WO 2006111805 | 10/2006 |
| WO | WO 2006111805 A1 | 10/2006 |
| WO | WO 2006135005 | 12/2006 |
| WO | WO 2007018560 | 2/2007 |
| WO | WO 2007055455 | 5/2007 |
| WO | WO 2007121486 A2 | 10/2007 |
| WO | WO 2007126720 A2 | 11/2007 |
| WO | WO2008003176 A1 | 1/2008 |
| WO | WO 2009/157999 A1 | 12/2009 |
| WO | WO 2010015825 A1 | 2/2010 |
| WO | WO 2010133772 | 11/2010 |

OTHER PUBLICATIONS

U.S. Appl. No. 11/899,790, filed Sep. 7, 2007, Wafer Level Phosphor Coating Method and Devices Fabricated Utilizing Method.
U.S. Appl. No. 11/473,089, filed Jun. 21, 2006, Close Loop Electrophoretic Deposition of Semiconductor Devices.
Official Notice of Rejection re related Japanese Patent Application No. 2007-533459, dated Jul. 29, 2008.
Patent Abstracts of Japan, Pub. No. 2001-181613,Date: Jul. 3, 2001.
Patent Abstracts of Japan, Pub. No. 11-040858, Date: Feb. 12, 1999.
Patent Abstracts of Japan, Pub. No. 2004-221185, Date: Aug. 5, 2004.
PCT International Search Report and Written Opinion, PCT/US2007/024366,dated Jul. 15, 2008.
Office Action re related U.S. Appl. No. 10/666,399, dated Sep. 5, 2008.
International Search Report for PCT/US2007/024367, dated Oct. 22, 2008.
Official Notice of Final Decision of Rejection re: related Japanese Patent Application No. 2007-533459, dated Dec. 26, 2008.
Rejection Decision re: related Chinese Patent Application No. 200580031382.3, dated Feb. 2, 2009.
Communication pursuant to Article 94(3) EPC re: related European Application No. 05808825.3, dated Feb. 18, 2009.
International Search Report and Written Opinion from related PCT Application No. PCT/US2009/001572, dated Jul. 17, 2009.
Office Action from related U.S. Appl. No. 11/656,759, dated Nov. 25, 2009.
Office Action from related U.S. Appl. No. 11/398,214, dated Dec. 11, 2009.
Office Action from related U.S. Appl. No. 10/666,399, dated Dec. 22, 2009.
Office Action from related U.S. Appl. No. 12/008.477, dated Mar. 1, 2010.
From related application. Japanese Patent Application No. 2006-526964, Official Notice of Rejection, dated Feb. 16, 2010.
Patent Abstracts of Japan, Publication No. 2003-258011 dated Sep. 12, 2003.
Patent Abstracts of Japan, Publication No. 2002-093830 dated Mar. 29, 2002.
Notice on Reexamination for Chinese Patent Application No. 200580031382.3 dated May 28, 2010.
Patent Abstracts of Japan No. 2002-050799 dated Feb. 15, 2002 to Stanley Electric Co. Ltd.
First Office Action for European Patent Application No. 07754163.9 dated Feb. 28, 2011.
Notice of Rejection (Final) in Japanese Patent Application No. 2006-526964 dated Feb. 22, 2011.
Minutes of Oral Proceedings (EPO Form 2009) in European Patent Application No. 05808825.3 dated Feb. 3, 2011.
Summons to Attend Oral Proceedings in European Patent Application No. 05808825.3 dated Feb. 3, 2011.
International Search Report and Written Opinion from PCT Application No. PCT/US2010/003190 dated Apr. 6, 2011.
International Search Report and Written Opinion from PCT/US2011/001200, dated Apr. 27, 2012.
First Office Action for Chinese Patent Application No. 201230001815.3, dated Apr. 11, 2012.
Summary of Notice of Reasons for Rejection from Japanese Patent Application No. 2007-228699, dated May 8, 2012.
Office Action for U.S. Appl. No. 12/883,979, dated Sep. 12, 2011.
Response to Office Action dated Sep. 12, 2011, U.S. Appl. No. 12/883,979, filed Feb. 7, 2012.
Notice of Allowance from U.S. Appl. No. 12/883,979, dated Mar. 19, 2012.
Office Action for U.S. Appl. No. 12/156,995, dated Aug. 30, 2011.
Response to Office Action dated Aug. 30, 2011, U.S. Appl. No. 12/156,995, filed Nov. 29, 2011.
Office Action for U.S. Appl. No. 12/288,957, dated Oct. 18, 2011.
Response to Office Action dated Oct. 18, 2011, U.S. Appl. No. 12/288,957, filed Dec. 19, 2011.
Advisory Action for U.S. Appl. No. 12/288,957, dated Jan. 11, 2012.
Response to Advisory Action U.S. Appl. No. 12/288,957, filed Feb. 15, 2012.
Office Action from Japanese Patent Application No. 2007-533459 (Appeal No. 2009-006588) dated Jul. 16, 2010.
Office Action from Chinese Patent Application No. 200780012387.0 dated Jun. 30, 2010.
Summons for Oral Proceedings for European Patent Application No. 05808825.3 dated Sep. 9, 2010.
Notification of the First Office Action for Chinese Patent Application No. 200780050127.2 dated Aug. 8, 2010.
Notice of Rejection for Japanese Patent Application No. 2006-526964 dated Oct. 5, 2010.
Response to Office Action from U.S. Appl. No. 11/656.759, filed Apr. 26, 2010.
Response to Office Action from U.S. Appl. No. 11/398,214, filed Mar. 2, 2010.
Response to Office Action from U.S. Appl. No. 10/666.399, filed Mar. 22, 2010.
Response to Office Action from U.S. Appl. No. 12/008,477, filed May 26, 2010.
Office Action from U.S. Appl. No. 12/077,638, dated Jul. 7, 2010.
Response to Office Action from U.S. Appl. No. 12/077,638, filed Aug. 30, 2010.
Office Action from U.S. Appl. No. 12/077,638, dated Sep. 22, 2010.
Response to Office Action from U.S. Appl. No. 12/077,638, dated Sep. 28, 2010.
Office Action from U.S. Appl. No. 10/666,399, dated May 11, 2010.
Response to Office Action from U.S. Appl. No. 10/666,399, filed Aug. 11, 2010.
Office Action from U.S. Appl. No. 11/881,683, dated May 12, 2010.
Response to Office Action from U.S. Appl. No. 11/881,683, filed Aug. 3, 2010.
Office Action from U.S. Appl. No. 11/656,759, dated May 21, 2010.
Office Action from U.S. Appl. No. 11/595,720, dated May 14, 2010.
Response to Office Action from U.S. Appl. No. 11/595,720, filed Jul. 7, 2010.
Office Action from U.S. Appl. No. 11/899,790, dated Jun. 2, 2010.
Response to Office Action from U.S. Appl. No. 11/899,790, filed Nov. 1, 2010.
Office Action from U.S. Appl. No. 12/506,989, dated Jul. 23, 2010.
Office Action from U.S. Appl. No. 12/008,477, dated Oct. 7, 2010.
Office Action from U.S. Appl. No. 11/827,626, dated Oct. 7, 2010.
Office Action from U.S. Appl. No. 11/881,683, dated Oct. 14, 2010.
Notice of Allowance from U.S. Appl. No. 10/666,399, dated Oct. 14, 2010.
Notification of the First Office Action for Chinese Patent Application No. 200780050197.8 dated Sep. 9, 2010.
Rexamination Decision No. 27346 for Chinese Patent Application No. 200580031382.3 dated Oct. 27, 2010.
International Search Report and Written Opinion for PCT/US2010/003168 dated Apr. 26, 2011.

(56) References Cited

OTHER PUBLICATIONS

Summary of Notice of Reasons for Rejection for Japanese Patent Application No. 2007-228699 dated May 10, 2011.
First Examination Report for European Patent Application No. EP 09 758 647.3 dated Jun. 21, 2011.
Notification of National Application Upon the Preliminary Examination of a Patent Application for Chinese Application No. CN 200980125244.X dated May 25, 2011.
Notice of Reasons for Rejection, Patent Appl. No. 2008-221738, dated Aug. 3, 2011.
Summary of "Notice of Reasons for Rejection" for Japanese Application No. 2007-228699 dated May 10, 2011.
Notice of Reasons for Rejection for Japanese Patent Application No. 2008-221738 dated Aug. 3, 2011.
Communication pursuant to Article 94(3) EPC for Patent Application No. 09 758 647.3-1226, dated Jun. 21, 2011.
First Office Action from Chinese Patent Application 200980142352.8, dated Aug. 27, 2012 (received Nov. 2, 2012).
Decision of Rejection from Japanese Patent Application No. 2008-221738, dated Feb. 26, 2013.
Decision of Dismissal of Amendment from Japanese Patent Application No. 2008-221738, dated Feb. 26, 2013.
Office Action from Japanese Patent Application No. 2011-512442. dated Feb. 22, 2013.
Satoshi Emoto, "How to make Mobile", [on line], May 30, 2001, ITmedia (searched on Feb. 15, 2013), internet URL:http//www.itmedia.co.jp/mobile/rensai/howtomake/04.
Office Action from Japanese Patent Appl. No. 2007-228699, dated Mar. 6, 2013.
Search Report from Chinese Patent Application No. 200980125244.X, dated Nov. 5, 2012.
Second Office Action from Chinese Patent Application No. 200980125244.X. dated Nov. 26, 2012.
PCT Preliminary Report and Written Opinion from PCT Appl. No. PCT/US2011/001200, dated Jan. 17, 2013.
First Office Action for Chinese Patent Application No. 200980125244.X, dated May 28, 2012.
Notice of Reasons for Rejection in Japanese Patent Application No. 2011-512442, dated Aug. 7, 2012.
Reason for Rejection for Japanese Patent Application No. 2011-510484, dated Aug. 7, 2012.
Office Action from Japanese Patent Appl. No. 2011-533175, dated Jul. 25, 2013.
International Search Report and Written Opinion for Appl. No. PCT/US2013/038391, dated Aug. 8, 2013.
Notice of Reconsideration from Japanese Patent Appl. No. 2008-221738, dated Jul. 9, 2013.
Examination Report from European Patent Appl. No. 10 757 645.6-1802, dated Jun. 28, 2013.
Decision of Rejection and Decision of Declining Amendment from Japanese Patent appl. No. 2011-512442, dated Jun. 19, 2013.
Office Action from U.S. Appl. No. 12/288,957, dated Sep. 21, 2010.
Response to Office Action from U.S. Appl. No. 12/288,957, filed Dec. 21, 2010.
Office Action from U.S. Appl. No. 12/629,735, dated Sep. 22, 2010.
Response to Office Action from U.S. Appl. No. 12/629,735, filed Dec. 22, 2010.
Office Action from U.S. Appl. No. 12/288,957, dated Mar. 9, 2011.
Office Action from U.S. Appl. No. 12/629,735, dated Mar. 10, 2011.
Office Action from U.S. Appl. No. 12/156,995, dated Mar. 10, 2010.
Response to Office Action from U.S. Appl. No. 12/156,995, filed Sep. 10, 2010.
Office Action from U.S. Appl. No. 12/156,995, dated Nov. 17, 2010.
Response to Office Action from U.S. Appl. No. 12/156,995, filed Apr. 18, 2011.
Second Office Action from Chinese Patent Application No. 200980142352.8, dated May 6, 2013.
Third Office Action from Chinese Patent Application No. 200980125244.X, dated May 31, 2013.
Office Action from U.S. Appl. No. 12/156,995, dated Apr. 12, 2012.
Response to OA from U.S. Appl. No. 12/156,995, filed Sep. 12, 2012.
Office Action from U.S. Appl. No. 12/643,670, dated Oct. 1, 2012.
Office Action from U.S. Appl. No. 13/489,035, dated Jan. 22, 2013.
Office Action from U.S. Appl. No. 12/862,640, dated Jan. 24, 2013.
Office Action from U.S. Appl. No. 13/029,005, dated Jan. 24, 2013.
Response to OA from U.S. Appl. No. 12/643,670, filed Dec. 21, 2012.
Response to OA from U.S. Appl. No. 13/489,035, filed Jun. 5, 2013.
Response to OA from U.S. Appl. No. 12/862,640, filed Apr. 17, 2013.
Response to OA from U.S. Appl. No. 13/029,005, filed Apr. 17, 2013.
Office Action from U.S. Appl. No. 13/177,415, dated Jan. 25, 2013.
Office Action from U.S. Appl. No. 12/629,735, dated Feb. 8, 2013.
Office Action from U.S. Appl. No. 12/544,131, dated Jan. 15, 2013.
Office Action from U.S. Appl. No. 12/643,705, dated Jun. 13, 2012.
Response to OA from U.S. Appl. No. 13/177,415, filed Apr. 23, 2013.
Response to OA from U.S. Appl. No. 12/629,735, filed Jun. 10, 2013.
Response to OA from U.S. Appl. No. 12/544,131, filed Mar. 13, 2013.
Response to OA from U.S. Appl. No. 12/643,705, filed Sep. 10, 2012.
Office Action from U.S. Appl. No. 12/862,640, dated Apr. 30, 2013.
Office Action from U.S. Appl. No. 12/288,957, dated Mar. 26, 2013.
Office Action from U.S. Appl. No. 13/177,415, dated May 2, 2013.
Response to OA from U.S. Appl. No. 12/288,957, filed Jun. 21, 2013.
Office Action from U.S. Appl. No. 13/177,415, dated May 7, 2014.
Office Action from U.S. Appl. No. 13/971,547, dated May 8, 2014.
Response to Office Action U.S. Appl. No. 13/971,547, filed Jul. 11, 2014.
Decision of Rejection from Chinese Patent Application No. 200980125244.X, dated Jan. 13, 2014.
Office Action from Japanese Patent Appl. No. 2013-064671, dated Feb. 3, 2014.
Appeal Board's Questioning from Japanese Patent Appl. No. 2011-512442, dated Jan. 17, 2114.
Extended European Search Report from European Patent Appl. No. 13197857.9, dated Feb. 7, 2014.
European Search Report from European Patent Appl. No, 10757645.6. dated Feb. 2, 2014.
Decision of Rejection from Japanese Patent Appl. No. 2007-228699, dated Mar. 18. 2014.
European Search Report from European Patent appl. No. 08252829.0, dated Feb. 28, 2014.
Office Action from Taiwanese Patent appl. No. 098109589, dated Feb. 18, 2014.
European Examination from European Patent appl. No. 11746482.4-1757, dated Feb. 21, 2014.
Office Action from U.S. Appl. No. 12/156,995, dated Jan. 24, 2014.
Office Action from Japanese Patent Appl. No. 2008-221738 dated Apr. 8, 2014.
Second Office Action from Chinese Patent Appl. No. 200980125251.X dated Apr. 3, 2014.
Office Action from Japanese Patent Appl. No. 2011-533175 dated Apr. 28, 2014.
Office Action from U.S. Appl. No. 12/643,670, dated Mar. 31, 2014.
Office Action from Taiwanese Patent Appl. No. 098136067, dated Jun. 26. 2014.
Office Action from Taiwanese Patent Appl. No. 098109569. dated Jul. 11, 2014.
Notice of Reasons for Rejection from Japanese Patent Appl. No. 2012-544480, dated Oct. 29, 2013.
Office Action from U.S. Appl. No. 13/971,547, dated Nov. 6, 2013.
Fourth Office Action from Chinese Patent Appl. No. 2009801423528, dated May 29, 2014.
Third Office Action and Search Report from Chinese Patent Appl. No. 2009801142352.8, dated Nov. 26, 2013.
Interrogation from Japanese Patent Appl. No. 2008-221738, dated Sep. 10, 2013.

(56) References Cited

OTHER PUBLICATIONS

First Office Action from Chinese Patent Appl. No. 200980125251, dated Aug. 8, 2013 (Received Oct. 4, 2013).
Search Report from Chinese Patent Appl. No. 200980125251, dated Jul. 31, 2013 (Received Oct. 14, 2013).
Office Action from U.S. Appl. No. 12/629,735, dated Sep. 18, 2013.
Office Action from U.S. Appl. No. 13/489,035, dated Aug. 5, 2013.
Response to OA from U.S. Appl. No. 13/489,035, filed Oct. 7, 2013.
Office Action from U.S. Appl. No. 12/156,995, dated Aug. 28, 2013.
Office Action from U.S. Appl. No. 12/288,957, dated Sep. 13, 2013.
Office Action from U.S. Appl. No. 12/643,670, dated Jun. 25, 2013.
Office Action from U.S. Appl. No. 13/177,415, dated Oct. 7, 2013.
Third Office Action from Chinese Appl. No. 200980125251.X. dated Oct. 31, 2014.
Pretrial Report from Japanese Appl. No. 2011-533175, dated Oct. 8, 2014.
Office Action from Taiwanese Patent Appl. No. 099105210, dated Oct. 20, 2014.
Reexamination Report from Japanese Appl. No. 2007-228699, dated Nov. 7, 2014.
Appeal Decision from Japanese Appl. No. 2013-12017. dated Nov. 25, 2014.
Reasons for Rejection from Japanese Appl. No. 2013-064671, dated Nov. 18, 2014.
International Preliminary Report from Appl. No. PCT/US2013/038391, dated Nov. 25, 2014.
Office Action from U.S. Appl. No. 12/156,995, dated Sep. 26, 2014.
Response to OA from U.S. Appl. No. 12/156,995, filed Nov. 19, 2014.
Office Action from U.S. Appl. No. 12/643,670, dated Oct. 15, 2014.
Office Action from U.S. Appl. No. 12/288,957, dated Nov. 19, 2014.
Office Action from U.S. Appl. No. 12/156,995, dated Dec. 8, 2014.
Office Action from U.S. Appl. No. 12/629,735, dated Dec. 18, 2014.
Office Action from U.S. Appl. No. 13/833,272, dated Dec. 31, 2014.
Office Action from U.S. Appl. No. 13/177,415, dated Jan. 8, 2015.
Office Action from U.S. Appl. No. 12/288,957, dated Feb. 5, 2015.
Office Action and Search Report from Taiwanese Patent Appl. No. 098109421. dated Aug. 22, 2014.
Notice of Reasons for Rejection from Japanese Patent Appl. No. 2012-544480, dated Aug. 5, 2014.
Office Action from U.S. Appl. No. 12/288,957, dated Aug. 12, 2014.
Fifth Office Action from Chinese Appl. No. 2009801423528, dated Dec. 31, 2014.
Second Office Action from Chinese Appl. No. 201080062058.9, dated Dec. 31, 2014.
Office Action from U.S. Appl. No. 12/643.670, dated Apr. 24, 2015.
Office Action from U.S. Appl. No. 12/156,995, dated May 5, 2015.
Office Action from Japanese Patent Appl. No. 2011-533175, dated Apr. 28, 2015.
Office Action from Taiwanese Patent Appl. No. 099145035, dated Apr. 24, 2015.
Summons to attend oral hearing from European Appl. No. 10757645.6-1802, dated Apr. 30, 2015.
Office Action from Japanese Appl. No. 2013-064671, dated Jun. 2, 2015.
Office Action from Taiwanese Appl. No. 098109421, dated Apr. 22, 2015.
Decision of Rejection and Non Acceptance of Amendment from Japanese Patent Appl. No. 2012-544480, dated May 12, 2015.
Office Action from U.S. Appl. No. 12/156,995, dated Sep. 4, 2015.
Office Action from U.S. Appl. No. 13/833,272, dated Sep. 24, 2015.
Office Action from U.S. Appl. No. 13/177,415, dated Oct. 16, 2015.
Notification of Reexamination from Chinese Patent Appl. No. 200980125244X. dated Oct. 15, 2015.
Notification of Filing Receipt (Reexamination) from Chinese Patent Appl. No. 200980142352.8, dated Nov. 10, 2015.
Trial Decision from Japanese Patent Appl. No. 2011-533175, dated Oct. 27, 2015.
Decision to Refuse a European Patent Application. European Patent Appl. No. 10757645.6, dated Oct. 27, 2015.
Decision of Reexamination from Chinese Patent Appl. No. 200980142352.8, dated Dec. 2, 2015.
Final Notice for Reasons for Rejection from Japanese Patent appl. No. 2013-064671, dated Jun. 2, 2015 (translations).
Decision of Rejection from Chinese Patent Appl. No. 200980142352.8, dated Jul. 14, 2015.
Office Action from U.S. Appl. No. 13/177,415, dated Jun. 18, 2015.
Response to OA from U.S. Appl. No. 13/177,415, filed Aug. 17, 2015.
Office Action from U.S. Appl. No. 12/629,735, dated Jul. 15, 2015.
Office Action from U.S. Appl. No. 12/288,957, dated Jul. 30, 2015.
Office Action from Korean Appl. No. 10-2011-7000240, dated Feb. 17, 2015.
Office Action from Taiwanese Appl. No. 098136067, dated Jan, 21, 2015.
First Office Action and Search Report from Chinese Appl. No. 2011800428038, dated Jan. 21, 2015.
First Office Action from Chinese Patent Appl. No. 201210492856.6, dated Jan. 5, 2015.
Notification of Reexamination from Chinese Patent Appl. No. 200980125244X, dated Mar. 2, 2015.
Office Action from Korean Patent Appl. No. 10-2010-7028850, dated Feb. 17, 2015.
Office Action for Japanese Application No. 2007-228699; dated Apr. 1, 2016.
Sixth Office Action for Chinese Application No. 2009801423528, dated Apr. 1, 2016.
Notice of Allowance for Application No. 10757645.6; dated Apr. 15, 2016.
Decision of Grant for Application No. 2012-544480; dated May 31, 2016.
Notice of Issuance for Chinese Application No. 20098012544, dated Jun. 16, 2016.
Office Action from U.S. Appl. No. 13/833,272; dated Jan. 6, 2016.
Office Action from U.S. Appl. No. 12/156,995; dated Feb. 16, 2016.
Decision of Rejection from Japanese Patent Appl. No. 2013-064671, dated Dec. 28, 2015.
Examination Report from European Patent appl. No. 11 748 482,4-1757, dated Nov. 16, 2015.
Oral Proceedings for European Application No. 9758647.3; dated Apr. 12, 2017.
Office Action for Chinese Application No. 200980142352.8; dated Jun. 2, 2017.
Office Action for U.S. Appl. No. 13/177,415; dated Sep. 26, 2017.
Foreign Office Action for European Application No. 08 252 829.0; dated Feb. 15, 2018.
Office Action for U.S. Appl. No. 13/177,415; dated May 2, 2018.
Foreign Office Action for European Application No. 09 745 149.6; dated May 15, 2018.
Yang Chih-Chieh et al: "Highly stable three-band white light from an InGaN-based blue light-emitting diode chip precoated with (oxy)nitride green/red phosphors", Applied Physics Letters, AIP, American Institute of Physics, Melville, NY, US, vol. 90, No. 12, Mar. 20, 2007 (Mar. 20, 2007), pp. 123503-123503, XP012093758, ISSN: 0003-6951.
Notice of Reasons for Rejection from Japanese Patent Application No. 2011-533175, dated Apr. 2, 2013.
Notice of Reasons for Rejection from Japanese Patent Application No. 2008-221738, dated May 29, 2012.
Office Action for U.S. Appl. No. 12/156,995: dated Dec. 23, 2017.
Official Decision for Japanese Patent Appl. No. 2007-226699: dated Jan. 20, 2017.
Nichia Corp. White LED Part No. NSPW300BS, Specification for Nichia White LED, Model NSPW300BS Jan. 14, 2004.
Nichia Corp. White LED Part No. NSPW312BS, Specification for Nichia White LED, Model NSPW312BS Jan. 14, 2004.
Lau, John, "Flip-Chip Technologies", McGraw Hill, 1996.
International Materials Reviews "Materials for Field Emission Displays", A.P. Burden 2001.
NPO-30394 Electrophoretic Deposition for Fabricating Microbatteries p. 1-2, NASA Tech Briefs Issue May 3, 2003.
Office Action from U.S. Appl. No. 12/156,995; dated Aug. 23, 2016.
Office Action from U.S. Appl. No. 13/833,272, dated Aug. 23, 2016.

(56) References Cited

OTHER PUBLICATIONS

Office Action from Chinese Patent Application No. 2009801423528, dated Sep. 21, 2016.
Office Action from European Patent Application No. 11748482 4. dated Oct. 18, 2016.

* cited by examiner

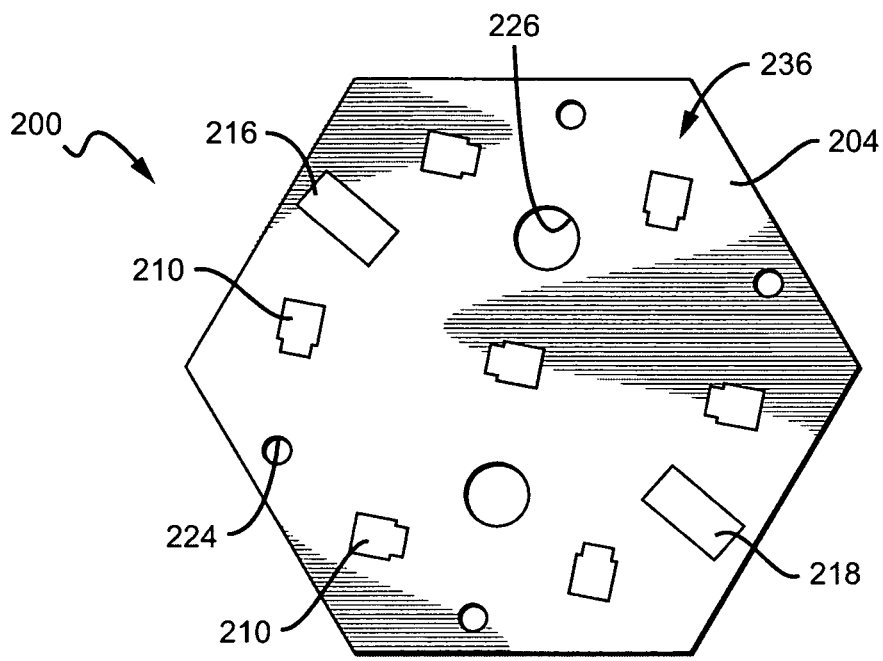
FIG. 5c
FIG. 5d
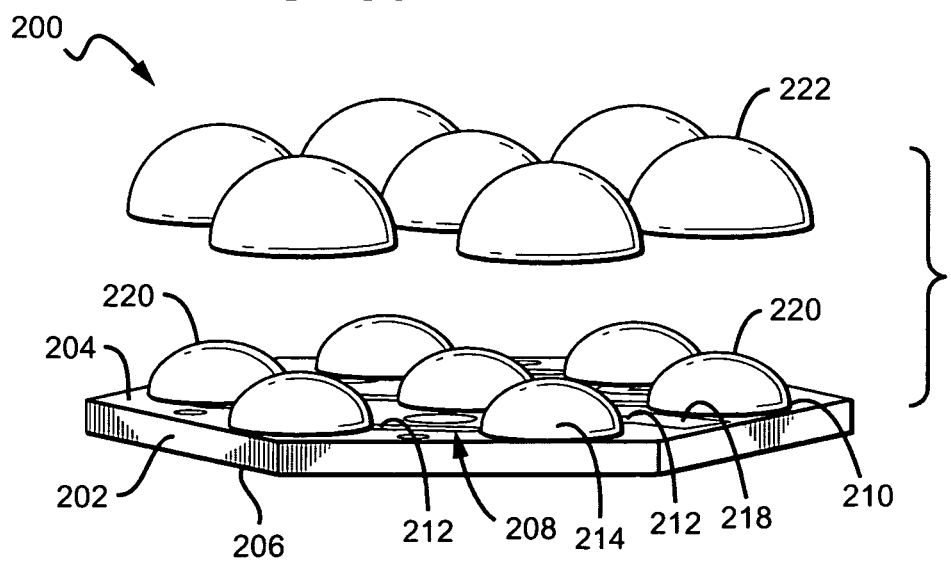

LED ARRAY AND METHOD FOR FABRICATING SAME

This application is a continuation-in-part of and claims the benefit of U.S. patent application Ser. No. 11/595,720 to Yuan et al., filed on Nov. 9, 2006 now U.S. Pat. No. 7,897,980.

The invention was made with Government support under Department of Energy Contract No. DE-FC26-05NT42340. The Government has certain rights in this invention.

BACKGROUND OF THE INVENTION

Field of the Invention

The invention relates to lighting systems, and more particularly to interconnected light emitting diode (LED) arrays.

Description of the Related Art

LEDs are semiconductor photon sources that can serve as highly efficient electronic-to-photonic transducers. They are typically forward-biased p-n junctions fabricated from a semiconductor material that emits light via injection electroluminescence. Their small size, high efficiency, high reliability, and compatibility with electronic systems make them very useful for a multitude of applications. Recent advancements have yielded high-power LEDs in a range of colors. This new generation of LEDs is useful in applications requiring a higher intensity light output such as high-power flash lights, airplane lighting systems, fiber-optic communication systems, and optical data storage systems.

High-flux lighting solutions are required by various modern applications such as street lighting, airport/airplane lighting systems, pool lighting systems, and many others. In order to achieve additional luminous output, multiple LEDs are often arranged in various configurations or arrays. These arrays may take nearly any shape and usually include several individual LEDs.

In order to further increase luminous output, several LED arrays may be grouped together on a surface. Providing the necessary electrical connections to power the LED arrays can be challenging. The layout of the individual LEDs on the array surface determines where the input and output connections must be located on the surface and how the LED arrays must be arranged so that they can be connected together.

As the number of LED arrays that are grouped together increases, the circuitry needed to connect the arrays can become complex and expensive. The circuit topology required to power the arrays often requires circuit elements that cannot be mounted on the surface of the arrays. This can result in circuit elements that obscure the light emitters and prevent the light from escaping to the outside environment, greatly decreasing the efficiency of the arrays.

SUMMARY OF THE INVENTION

One embodiment of an emitter array according to the present invention comprises a submount having a plurality of edges, with input and output terminals and a plurality of attach pads on the submount. A plurality of solid state emitters is included, with at least one of each mounted on and electrically connected to each of the attach pads. The attach pads cover more of the submount than the emitters and laterally spread heat from the emitters to the surface of the submount. Electrical connections are also included that connect the emitters and attach pads with the input and output terminals. A plurality of lenses are also included each of which is molded over a respective one of the attach pads and each of which covers the emitters attached to the respective one of the attach pads.

One embodiment of an LED array according to the present invention comprises a submount having a top surface, a bottom surface and a plurality of edges. Input and output terminals are disposed on the top surface, and a plurality of electrically and thermally conductive elements are on the top surface. A plurality of LEDs is attached to the conductive elements, so that an electrical signal applied to the conductive elements causes the LEDs to emit light. At least some of the conductive elements also spread heat from the LEDs across the top surface. A plurality of lenses is included each of which is molded over a respective one of the electrical elements.

One embodiment of a lamp according to the present invention comprises a lamp body having an opening and a light source arranged within the body to radiate light out of the body through the opening. The light source comprising a plurality of arrays arranged in an expandable tiling on a surface, and a network of conductors connected to provide power to the arrays. Each of the arrays comprises an input and an output terminal on a submount with the terminals connected to the network. A plurality of top electrically and thermally conductive elements is included on a surface of the submount, and a plurality of LEDs is included at least one of which is attached to the top elements with power from the network causing the LEDs to emit light. The top elements also spread heat from the LEDs across the submount top surface. A plurality of lenses is also included each of which is molded to the submount over at least one of the LEDs.

One embodiment of a method for fabricating an array according to the present invention comprises providing a submount and forming sets of electrically conductive features on one surface of the submount. A plurality of LEDs are attached to the electrically conductive features such that the LEDs are electrically connected by the plurality of conductive features. The conductive features are sized to spread heat from the LEDs into at least a portion of the submount. A plurality of lenses are molded on the submount with each of the lenses over one of the LEDs. Alternative methods can also be used to fabricate a plurality of arrays from a submount panel, including the step of singulating the panel to separate the individual arrays from the panel.

BRIEF DESCRIPTION OF THE DRAWINGS

FIG. 5b is a plan view of the submount and conductive features for the device shown in FIG. 5a.

FIG. 5c is a plan view of the submount shown in FIG. 5b with a solder mask.

FIG. 5*d* is a perspective view of the device shown in FIG. 5*a* with secondary optics.

DETAILED DESCRIPTION OF THE INVENTION

Figure 1A:
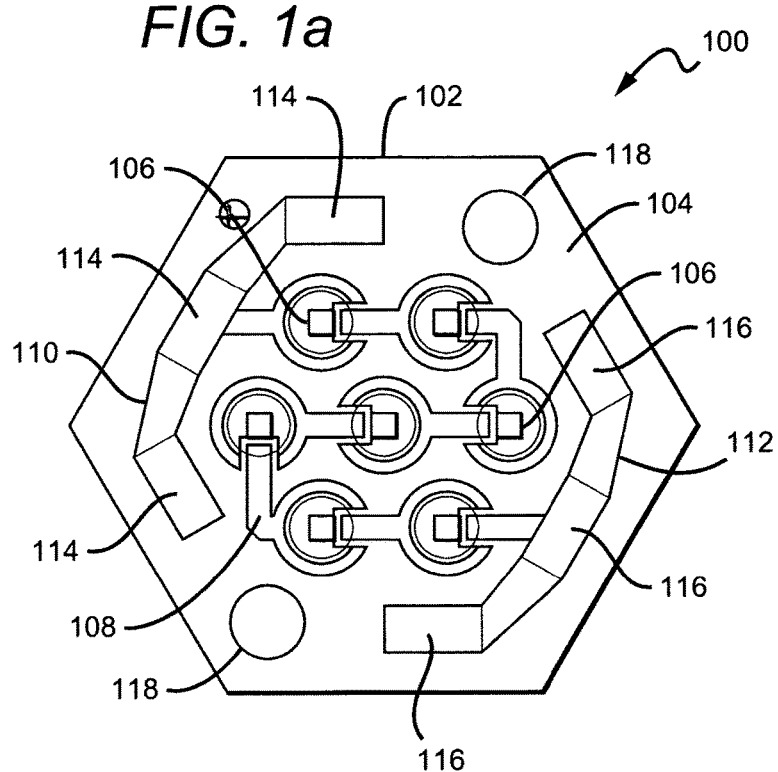
FIG. 1a is a top plan view of a light emitting device or array according to one embodiment of the present invention.

The present invention is directed to compact, simple and efficient light emitting devices or arrays and methods for manufacturing same. Each array can comprise a submount with a plurality of LEDs coupled together to emit light simultaneously when an electrical signal is applied to the array. The arrays according to the present invention can include features to provide for improved thermal management including spreading heat from the LED into the submount from where the heat can then dissipate into a heat sink attached at the bottom of device or the ambient. This allows the arrays to operate under higher power and emit higher luminous flux without overheating.

The submounts of the arrays are shaped so that multiple arrays can be mounted closely together and electrically connected to form a light source wherein all the arrays emit light in response to an electrical signal. Depending on the requirements for the particular application, different numbers of arrays can be coupled together. Arrays according to the present invention can also comprise lenses molded directly over their LEDs to protect the LED while still allowing for efficient emission characteristics. Secondary optics can also be included over the lenses to further shape or disperse the LED light. The present invention is also directed to methods for fabricating arrays that generally comprise molding lenses directly over the LEDs on the arrays.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The present invention can be used with many different solid state emitters with the embodiments of the invention below being described in relation to LEDs, and in particular to white emitting LEDs. The lighting devices or arrays utilizing the white emitting LEDs provide a white emitting light source. It is understood however that different LEDs emitting at different colors can also be used, so that the array emits the color from its LEDS. It is also understood that different colors of LEDs can be used in a single array to generate the desired color of light. For example, red emitting LEDs can be combined with white emitting LEDs so that the array emits a warm white light. The present invention can also be used in many different applications and the discussion of the present invention with reference to the following embodiment should not be construed as limiting to the that particular embodiment or similar embodiments.

FIG. 1*a* shows one embodiment of a light emitting device or array 100 according to the present invention. Light emitting array 100 can serve as an array element when linking several of the devices together to increase luminescent output. Substrate/submount 102 comprises top surface 104 and a bottom surface (not shown). Various electronic and optical components can be mounted to top surface 104 including at least one light emitting element 106. In many embodiments a plurality of light emitting elements 106 are included on the submount 102. Such components may include vertical cavity surface emitting lasers (VCSELs), light emitting diodes (LEDs), or other semiconductor devices. In one embodiment the element 106 comprises an LED.

LED structures and their fabrication and operation are generally known in the art and only briefly discussed herein. The layers of an LED can be fabricated using known processes with a suitable process being fabrication using metal organic chemical vapor deposition (MOCVD). The layers of LEDs generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in the LED, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide are typically not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LED can also comprise a conductive current spreading structure and one or more wire bond pads on its top surface, both of which are made of a conductive material and can be deposited using known methods. Some materials that can be used for these elements include Au, Cu, Ni, In, Al, Ag or combinations thereof and conducting oxides and transparent conducting oxides. The current spreading structure generally comprises conductive fingers arranged in a grid on the LED with the fingers spaced to enhance current spreading from the pads into the LED's top surface. In operation, an electrical signal is applied to the pads through a wire bond as described below, and the electrical signal spreads through the fingers of the current spreading structure and the top surface into the LED. Current spreading structures are often used in LEDs where the top surface is p-type, but can also be used for n-type materials.

The LED can be coated with one or more phosphors with the phosphors absorbing at least some of the LED light and emitting a different wavelength of light such that the LED emits a combination of light from the LED and the phosphor. In a preferred embodiment the LED emits a white light combination of LED and phosphor light. The LED can be coated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The light emitting elements 106 are mounted to top surface 104 and are shown connected in series via conductive features or traces 108 which is disposed on top surface 104. The traces 108 can be made of different conductive materials such as metals. The light emitting elements 106 can also be connected in a parallel configuration or in a combination of series and parallel connections. Input terminal 110 is located near the edge of submount 102. Output terminal 112 is located near the opposite edges of submount 102 across from input terminal 110. Current from a power source (not shown) flows from input terminal 110 through light emitting elements 106 to output terminal 112, illuminating the array 100.

Submount 102 can have many different shapes with a preferred shape being a regular hexagon. However, submount 102 may also be shaped as a regular polygon such as a square, a pentagon, etc. Submount 102 may also be shaped as an irregular polygon. Submount 102 as shown in FIG. 1a is a regular hexagon having six edges of equal length. In this embodiment, input terminal 110 is disposed along three adjacent edges. Input terminal 110 comprises three input contact pads 114, each of which is located near to a corresponding one of the three input-side edges. Output terminal 112 comprises three output contact pads 116 which are located near the three adjacent edges on the output-side, opposite the input terminal 110.

The input and output contact pads 114, 116 are disposed on top surface 104 along the edges to provide easy access to the input and output terminals 110, 112. This allows for flexibility when designing an array layout to connect several light emitting array elements.

Several light emitting elements 106 may be mounted to top surface 104 and can be arranged in many different configurations on top surface 104. The light emitting elements can be connected in parallel, in series, or in a combination of both to achieve optimal light output. A preferred pattern comprises seven light emitting elements 106 arranged in a serial serpentine pattern as shown in FIG. 1a. Current flows from input contact pad 114 through all of the light emitting elements 106 to output contact pad 116.

Bore holes 118 are disposed near opposite vertices between the outer input and output contact pads 114, 116. Bore holes 118 are used to facilitate mounting the devices to a surface. They can be sized to accommodate a variety of screws or mounting pins.

Figure 1B:
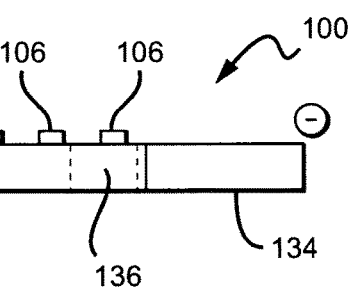
FIG. 1b is a side view of a light emitting device according to one embodiment of the present invention.

FIG. 1b is a side front view of a light emitting array 100 according to one embodiment of the present invention. Light emitting array 100 has a top surface 104 and a bottom surface 132. Lighting elements 106 are mounted to top surface and electrically connected.

Because lighting elements 106 can generate large amounts of heat, it may be necessary to channel that heat away from lighting elements 106 and other circuit elements that might be damaged by the heat. One method to dissipate the excess heat that is generated into the ambient atmosphere is to incorporate a heat spreader into the device. There are several designs which can be used to achieve thermal dissipation. FIG. 1b illustrates one such design. Heat spreader 134 has a high thermal conductivity over a broad range of temperatures and is disposed beneath top surface 104. Heat spreader 134 may be made from copper, aluminum and ceramic, for example; although it could also be made from any high thermal conductivity material. In the design shown in FIG. 1b, heat spreader 134 forms the bottom surface 132 of the device.

The embodiment of light emitting array 100 as illustrated in FIG. 1b is oriented such that input terminal 110 (not visible in this view) is on the left-hand side of the figure as indicated by the positive sign (+). Likewise the output terminal 112 (not visible in this view) is on the right-hand as indicated by the negative sign (−). In this embodiment viewed from this orientation, an output contact pad 116 (not visible in this view) is disposed near the front edge.

Bore holes 136 are shown with dashed lines to indicate that they are set off a distance from the front edge of array 100. The holes 136 pass through top and bottom surfaces 104, 132, allowing array 100 to be easily mounted to other surfaces. As mentioned above, devices 100 can be mounted to a surface in several different ways including but not limited to methods using screws, epoxy adhesives and solders.

Figure 2:
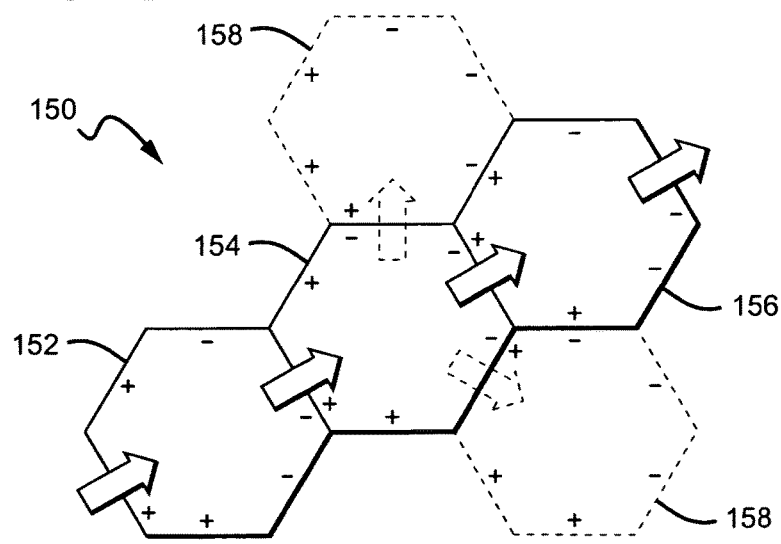
FIG. 2 is a top plan view of a plurality of LED array elements arranged in a tiling on a flat surface according to one embodiment of the present invention.

FIG. 2 is a top plan view of a light source 150 according to the present invention having three light emitting devices or arrays 152, 154, 156 according to one embodiment of the present invention. Devices 152, 154, 156 are connected in a serial arrangement. The arrows indicate the direction of current flow through the devices. Current flows into 152 at one of the edges marked with a positive (+). The current then flows through the light emitters (not shown), out of device 152 at one of the edges marked with a negative sign (−), and into one of the positive edges of device 154. Device 156 is shown positioned adjacent to the middle negative edge of device 154.

However, device 156 can also be disposed in either of two alternate positions 158 (shown with hashed lines). Because the positive and negative terminals are easily accessible from multiple sides of each device, there is a great deal of flexibility in designing the layout of the devices in an array and the path through which current will flow. The layout of FIG. 2 is just one simple example of an array of devices and is meant to illustrate the additional freedom of design afforded by various embodiments of the invention. One skilled in the art will recognize that the devices can be easily rotated, shifted and expanded to achieve a desired layout and current flow. An example of such an array is described below and illustrated in FIG. 3.

Figure 3:
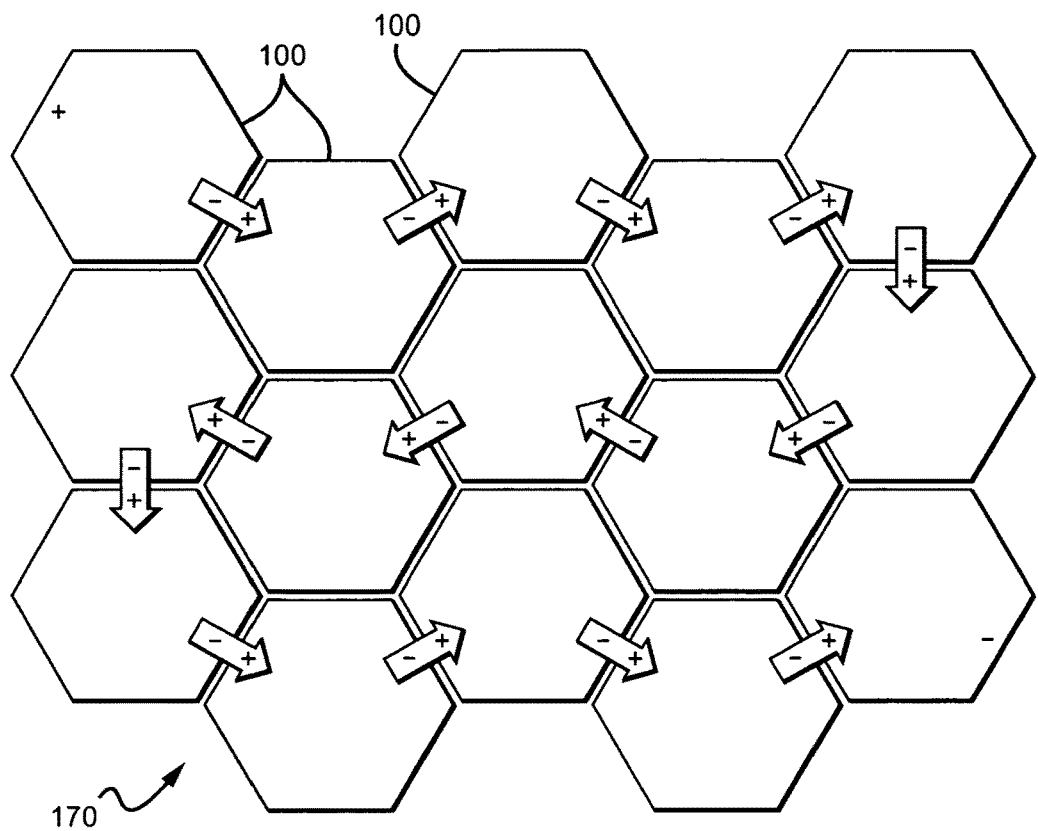
FIG. 3 is a top plan view of a plurality of LED array elements arranged in a tiling on a flat surface according to one embodiment of the present invention.

FIG. 3 is a top plan view of an array 170 of light emitting devices 100 according to one embodiment of the present invention. Devices 100 function as array elements and are arranged in a tiling which can be expanded in all directions to accommodate luminescent output requirements. Devices 100 are oriented such that edges of the respective devices that face each other are parallel. Spacing between the devices 100 can vary according to design specifications, for example, to accommodate different types of conductors. In this embodiment the devices 100 are mounted on a flat surface.

In the orientation shown in FIG. 3, current from a power source (not shown) enters the array at the upper left-hand corner as indicated by the positive sign (+). Current then travels from the input terminals through the light elements to the output terminals in each array element. The output terminals are connected to the input terminals of adjacent array elements via conductors (not shown). According to this embodiment, current travels through the array elements in a serpentine pattern. The direction of current flow is shown as indicated by the arrows. However, there are many possible array layouts that may be employed to achieve design goals.

Because the input and output terminals are accessible from three sides in this particular embodiment, the design engineer has a great deal of flexibility in arranging the array elements. The array can be expanded in any direction, allowing for various circuit connection schemes and increasing output efficiency.

Other embodiments may utilize array elements having different shapes such as squares, pentagons, or octagons, for example. Combinations of such shapes may also be used to develop a specific array layout.

Figure 4:
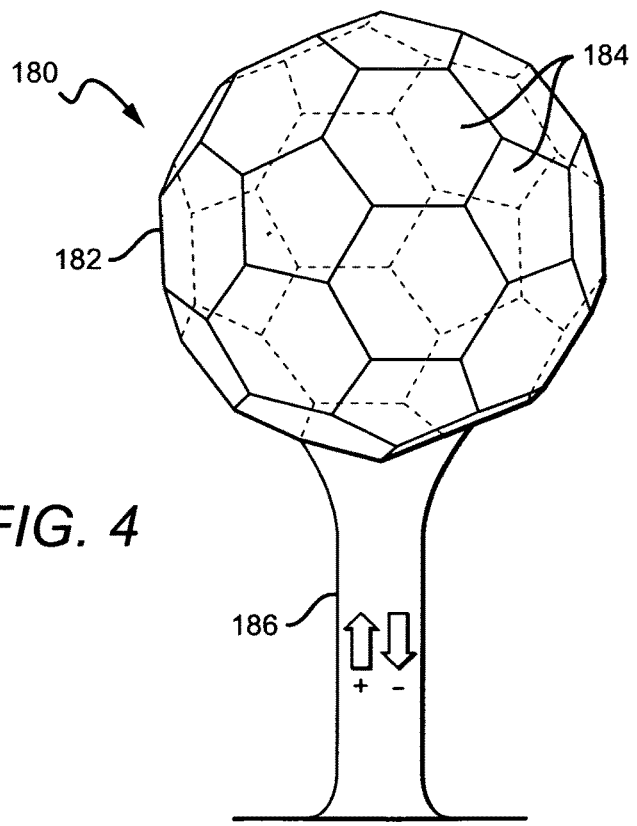
FIG. 4 is a perspective view of a plurality of LED array elements arranged in a tiling on a three-dimensional surface according to one embodiment of the present invention.

FIG. 4 is a perspective view of a three-dimensional (3-D) array 180 of light emitting devices 184 according to one embodiment of the present invention. Devices 184 may be mounted to the surface of a 3-D structure 182 to achieve omnidirectional luminescence. This particular embodiment comprises hexagonal and pentagonal array elements 184 that correspond to the substantially spherical 3-D structure 182 on which the devices 184 are mounted.

In this embodiment the structure 182 is mounted on a support 186. Current may be delivered from a power source (not shown) either external to the structure 182 or from within the structure 182 or the support 186. This particular embodiment illustrates a power source external to the structure 182. Current flows through some or all of the array elements 184 and back out of the structure 182 as shown by the polarity arrows.

Alternate embodiments may include structures having any 3-D shape. Array elements that are mounted to those structures may also come in any shape in order to efficiently cover part or all of the surface of the structure.

FIGS. 5a through 5f show another embodiment of a light emitting device or array 200 comprising a substrate/submount 202 having a top surface 204 and bottom surface 206. The substrate/submount can be made of many different structures and materials such as a printed circuit board (PCB), metal core printed circuit board (MCPCB). Other suitable materials include, but are not limited to ceramic materials such as aluminum oxide, aluminum nitride or organic insulators like polyimide(PI) and polyphthalamide (PPA) laminated with thermally and electrically conductive materials such as copper or other similar materials. In other embodiments the submount 202 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

As more fully described below, arrays according to the present invention can be fabricated using a method that utilizes a submount panel sized to accommodate a plurality of arrays. Multiple arrays can be formed on the panel, with the individual arrays being singulated from the panel. In other embodiments the arrays can be fabricated from separate submounts instead of a panel of submounts.

Figure 5A:
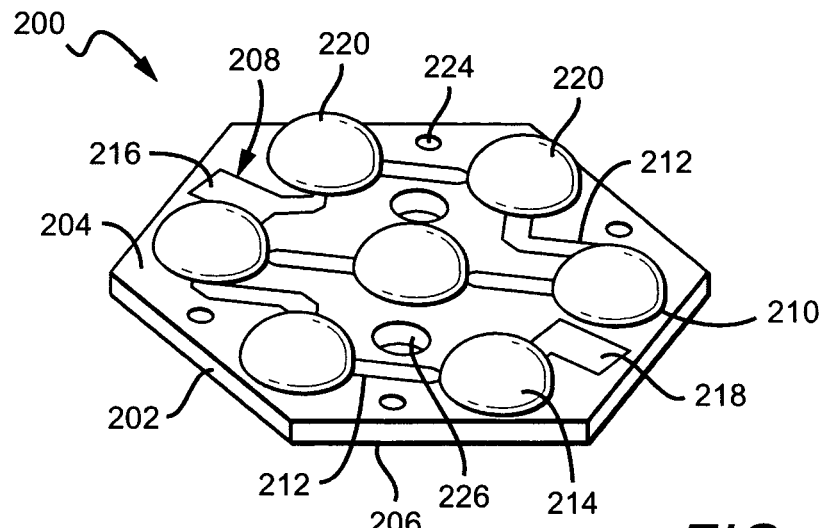
FIG. 5a is a perspective view of another light emitting device or array according to the present invention.
Figure 5B:
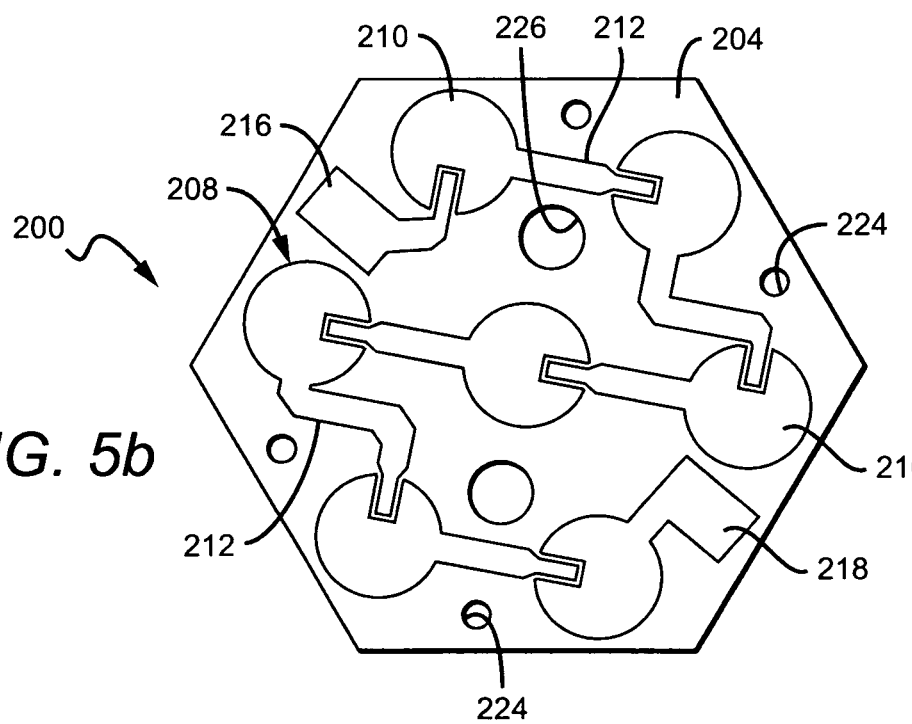

As best shown in FIGS. 5a and 5b, the submount's top surface 204 comprises patterned conductive features 208 that can include a plurality of die attach pads 210 and interconnecting conductive traces 212. Referring to FIGS. 5a and 5c through 5f, a plurality of LEDs 214 are provided that can be the same as the LEDs described above with reference to element 106 in FIGS. 1 and 2. Each of the LEDs 214 are mounted to a respective one of the attach pads, with each approximately at the center of its pad 210. It is understood that in alternative embodiments multiple LEDs can be mounted to each of the respective one of the attached pads, with the LEDs emitting the same or different colors of light. Each of the LEDs can be electrically interconnected in a combination of serial and/or parallel connections. For example, the LEDs on at least some of the attach pads can be connected in parallel, such that the array comprises a serial connection between the pads with the attach pads having a parallel connection.

The patterned conductive features 208 provide conductive paths for electrical connection to the LEDs 214 using known contacting methods. The LEDs can be mounted to the attach pads 210 using known methods and materials such as using conventional solder materials that may or may not contain a flux material, or dispensed polymeric materials that may be thermally and electrically conductive.

The attach pads 210 and traces 212 can comprise different materials such as metals or other conductive materials. In one embodiment the pads 210 and traces 212 can comprise copper deposited using known techniques such as plating. In typical plating processes a titanium adhesion layer and copper seed layer are sequentially sputtered onto a substrate. Then, approximately 75 microns of copper is plated onto the copper seed layer. The resulting copper layer being deposited can then be patterned using standard lithographic processes. In other embodiments the layer can be sputtered using a mask to form the desired pattern.

In some embodiments according to the present invention some of the conductive features 208 can include only copper, with others of the features including additional materials. For example, the attach pads 210 can be plated or coated with additional metals or materials to the make each more suitable for mounting LEDs 214. In one such embodiment the attach pads 210 can be plated with adhesive or bonding materials, or reflective and barrier layers. A wire bond (not shown) can be included between each LED 214 and an adjacent one of the traces 212 such that all the LEDs are connected in series between the pads 210 and the traces 212. Other methods to connect the LEDs on the attach pad 210 with the traces 212 can comprise a flip-chip bonded LED with co-planar metal contacts (e.g. stud bumps) on the LED providing the connection between the attach pad 210, the traces 212, and the LED diode contacts.

The conductive features 208 can also comprise input and output contact pads 216, 218, that can be made of the same materials and deposited in the same way as the other conductive features. The contact pads 216, 218 are typically on opposing sides of the submount with the input contact pad 216 coupled to a trace 212 leading to the first in the series of attach pads 210, and the output contact pad 218 coupled to the last in the series attach pads. With the LEDs 214 mounted in place on the their attach pads 210 and electrically connected to the traces 212, a signal applied to the input contact pad 216 conducts through each of the LEDs 214, attach pads 210 and interconnecting traces 212, to the output contact pad 218. The signal could then be transmitted to another similar array 200 using known jumper methods.

To improve heat dissipation in the array 200 from the LEDs 214, the attach pads 210 can provide thermally conductive paths to conduct heat away from the LEDs 214 such that heat can spread to other areas of the submount beyond the areas just below the LEDs 214. The attach pads 210 cover more of the surface of the top surface 204 than the LEDs 214, with the attach pads extending from the edges of the LEDs 214. In the embodiment shown, each of the attach pads 210 are generally circular and extend radially from its respective one of the LEDs 214. It is understood that the contact pads 216, 218 can be many other shapes and in some embodiments it can extend further on the submount's top surface to improve thermal dissipation of heat generated in the LED 214.

In embodiments where the submount 202 comprises a metal core printed circuit board, adequate levels of heat can spread from the attach pads 210 through the submount 202. In embodiments where the submount comprises a material that is less thermally conductive, such as a ceramic, additional elements can be included to further assist in heat dissipation. In one such embodiment, the submount's bottom surface 206 can comprise a separate thermal pad or sets of thermal pads that can be in vertical alignment with the attach pads on the top surface. The bottom thermal pads serve to dissipate heat or conduct heat to heat sink from where head is dissipated into the ambient.

Although heat from the LEDs 214 is spread over the top surface 204 of the submount 202 by the attach pads 210 more heat will pass into the submount 202 directly below and around the LEDs 214. The metalized area can assist with this dissipation by allowing this heat to spread into the metalized area where it can dissipate more readily. The metalized layer can be made of known thermally conductive materials, such as metals, deposited using known techniques.

In other embodiments the array can be arranged for surface mounting by having surface mount contacts (not shown) on the submount's bottom surface 206. The input and output contact pads 216, 218 can also be connected to the submount bottom surface using electrically conductive via connections. By providing the corresponding set of pads on the bottom surface of the submount, the arrays can be interconnected by using known printed circuit board and surface mount technology. The surface mount contacts are arranged to be compatible with surface mount processes, and can be in electrical contact with the conductive features on the submount's top surface 204. In one embodiment conductive vias can be included through the submount to provide this electrical connection.

An optical elements or lenses 220 are formed on the submount's top surface 204, with each of the lenses being over a respective one of the LEDs 214 to provide both environmental and/or mechanical protection. The lenses 220 can be in different locations on the top surface 204 with the lenses located as shown with their respective one of the LEDs 214 at approximately the center of the lens base. In some embodiments each or some of the lenses 220 can be formed in direct contact with one of the LEDs 214 and the submount's top surface 204. In other embodiments there may be an intervening material or layer between the LED 220 and/or top surface 204. Direct contact to the LED 214 provides certain advantages such as improved light extraction and ease of fabricating.

As further described below, the lenses 220 can be molded over the LEDs 214 using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that one or more of the lenses 220 can also be textured to improve light extraction or can contain materials such as phosphors or scattering particles.

In other embodiments, the array can also comprise a protective layer (not shown) covering the submount's top surface 204 not covered by the lenses 220. The protective layer can provide additional protection to the elements on the top surface 204 to reduce damage and contamination during subsequent processing steps and use. The protective layer can be formed during formation of the lenses 220 and can comprise the same material as the lenses 220. Openings should be formed in the protective layer to provide access to the first and second contact pads 216, 218, with the openings formed using known processes.

Figure 5E:
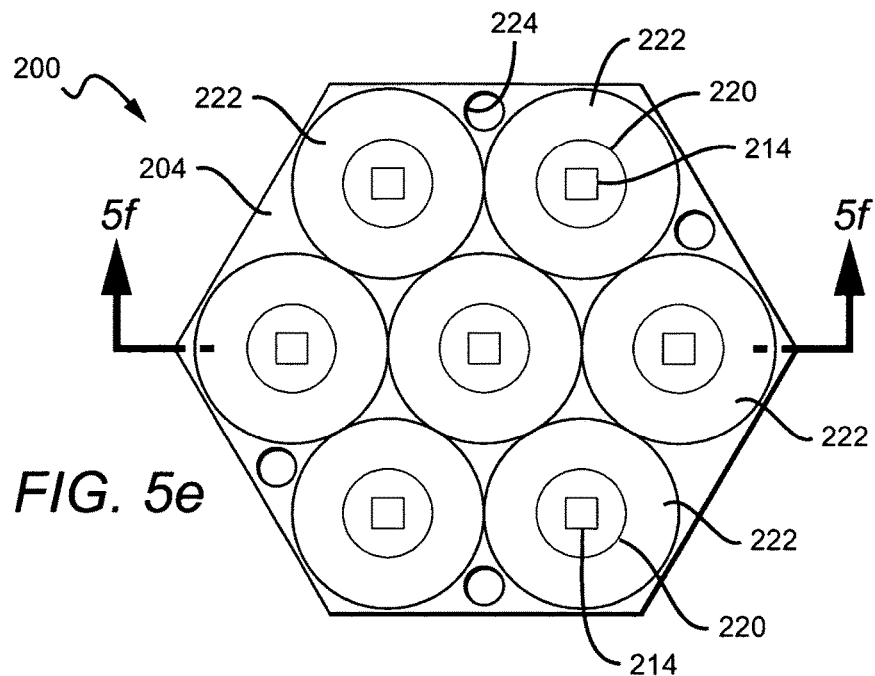
FIG. 5*e* is plan view of the device shown in FIG. 5*a* with secondary optics.
Figure 5F:
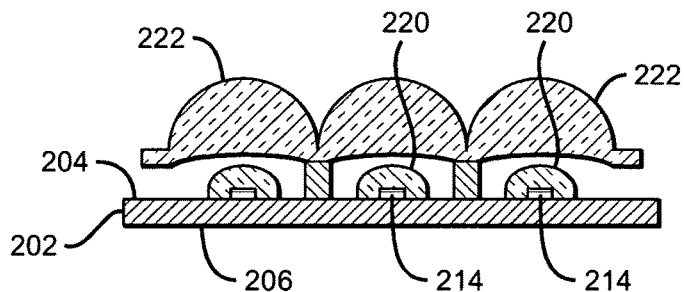
FIG. 5*f* is a sectional view of the device shown in FIG. 5*e* taken along section lines 5*e*-5*e*.

As best shown in FIGS. 5d through 5f, the arrangement of the lenses 220 is also easily adapted for use with secondary optics 222 that can be included over the lenses during fabrication of the array 200 or by the end user. The optics 222 can be included for different purposes such as to facilitate beam shaping or beam dispersion. Secondary optics are generally known in the art, with many of them being commercially available. They can be formed from many different materials such as plastics (PMMA, PC) and can be formed from processes such as injection molding. In other embodiments the lenses can be made of glass and can also be formed using known methods. The optics 222 can be integrated into a single assembly (as shown) that mounts as one piece over the lenses 220, or in other embodiments the optics can comprise individual pieces, each of which is mounted over a respective one of the lenses 220. The optics 222 can be mounted over the lenses using known mounting and bonding techniques.

The array 200 also comprises registration thru-holes 224 arranged to assist in aligning the secondary optics 222 to the array 200 during mounting of the optics. Lockdown thru-holes 226 are also included for mounting the array 200 in place for use, such as to a heat sink in a lamp.

The array 200 can also comprise elements to protect against damage from electrostatic discharge (ESD). These elements (not shown) can be mounted to the submount 202, and different elements can be used such as various vertical silicon (Si) Zener diodes, different LEDs arranged in parallel and reverse biased to the LEDs, surface mount varistors and lateral Si diodes.

As best shown in FIG. 5c, a solder mask 236 can be included on the submount's top surface 204, at least partially over the attach pads 210 and the first and second contact pads 216, 218, and covering the traces 212. The solder mask 236 protects these features during subsequent processing steps and in particular mounting the LEDs 214 to the attach pads 210 and wire bonding. During these steps there can be a danger of solder or other materials depositing in undesired areas, which can result in damage to the areas or result in electrical shorting. The solder mask serves as an insulating and protective material that can reduce or prevent these dangers. It may also serve to promote the adhesion of the lenses to the submount surface 204. The solder mask comprises opening for mounting the LEDs 214 to the attach pads 210 and for attaching wire bonds to the traces 212. It also comprises side openings on the contact pads 216, 218 for connecting jumpers between adjacent arrays.

Figure 6A:
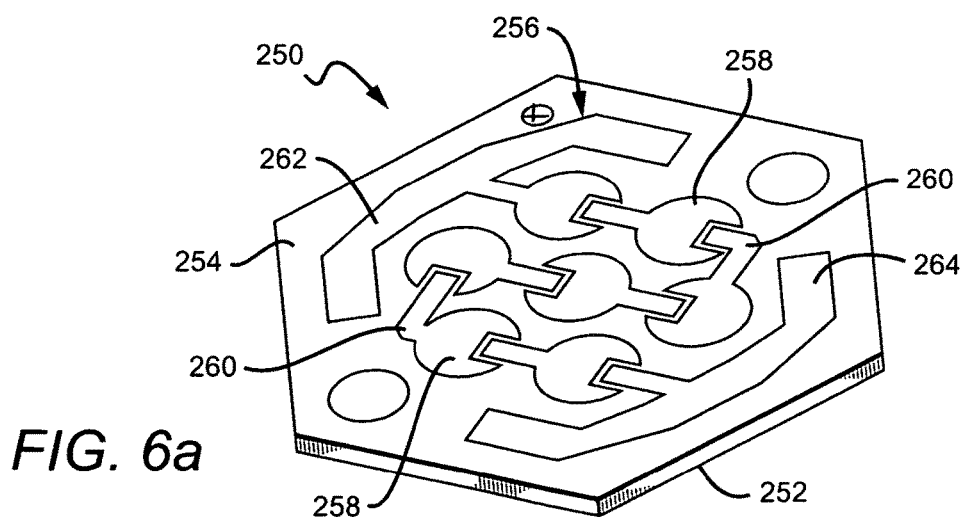
FIG. 6*a* is a perspective view of a submount that can be used in another embodiment of light emitting device or array according to the present invention.
Figure 6B:
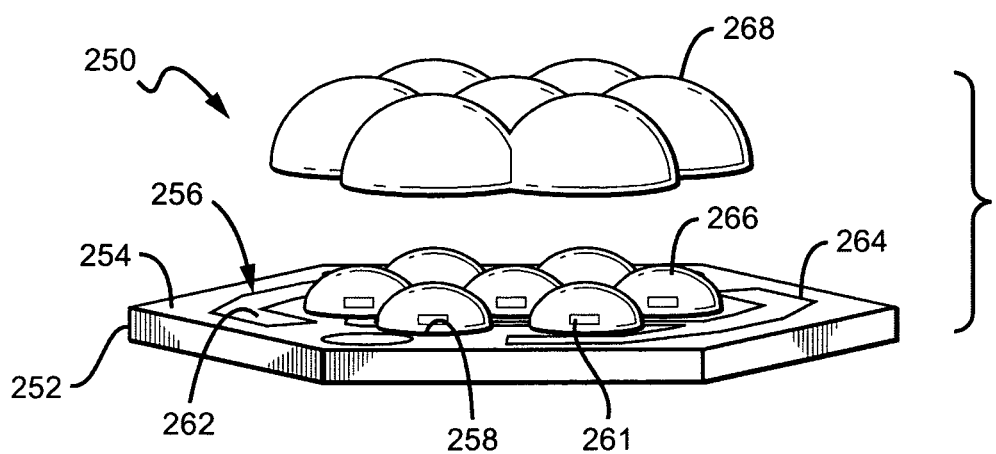
FIG. 6*b* is a perspective view of another embodiment of a light emitting device or array according to the present invention.

FIGS. 6a and 6b show another embodiment of an array 250 according to the present invention having a submount 252 similar to the submount 102 shown in FIGS. 1-3 and described above, but also comprises molded lenses. The submount 252 has a top surface 254 having electrically conductive features 256 comprising die attach pads 258, interconnecting traces 260. LEDs 261 are mounted to the attach pads 258 as described above and electrically connected to their adjacent traces 260, so that the LEDs are connected in series or in parallel (not shown). The attach pads 258 are arranged to extend on the top surface of the submount 252 to facilitate lateral heat spreading from the LEDs 261, and to allow the heat to spread into the submount where it can dissipate.

First and second contact pads 262, 264 are arranged on the top surface 254 to provide access to each of the pads 262, 264 from three edges of the submount 252. This provides flexibility in connecting several luminaries in an array.

The array 250 further comprises lenses 266 and secondary optics 268 similar to the lenses 220 and secondary optics 222 described above in conjunction with FIGS. 5a through 5f. The array 250 can also comprise lock down thru holes for mounting by the end user, such as in a lamp.

Contact pads 262, 264 are around three edges of the submount 252, which leaves less area for the attach pads around the edges. Accordingly, for these embodiments the attach pads can be located closer to the center of the submount compared to those embodiments not having contacts around the edges.

Arrays according to the present invention can be arranged in many different ways from the arrays 100, 200, 250 described above, and can be include different elements or components beyond those described above. In some embodiments electrical drive circuits or electrical conditioning circuits can be included on the array either as discrete or integrated components. The arrays can also comprise other elements to enhance heat spreading such as heat fins or various heat sinks. Accordingly, the present invention should not be construed as limited to the embodiments shown and described.

Figure 7:
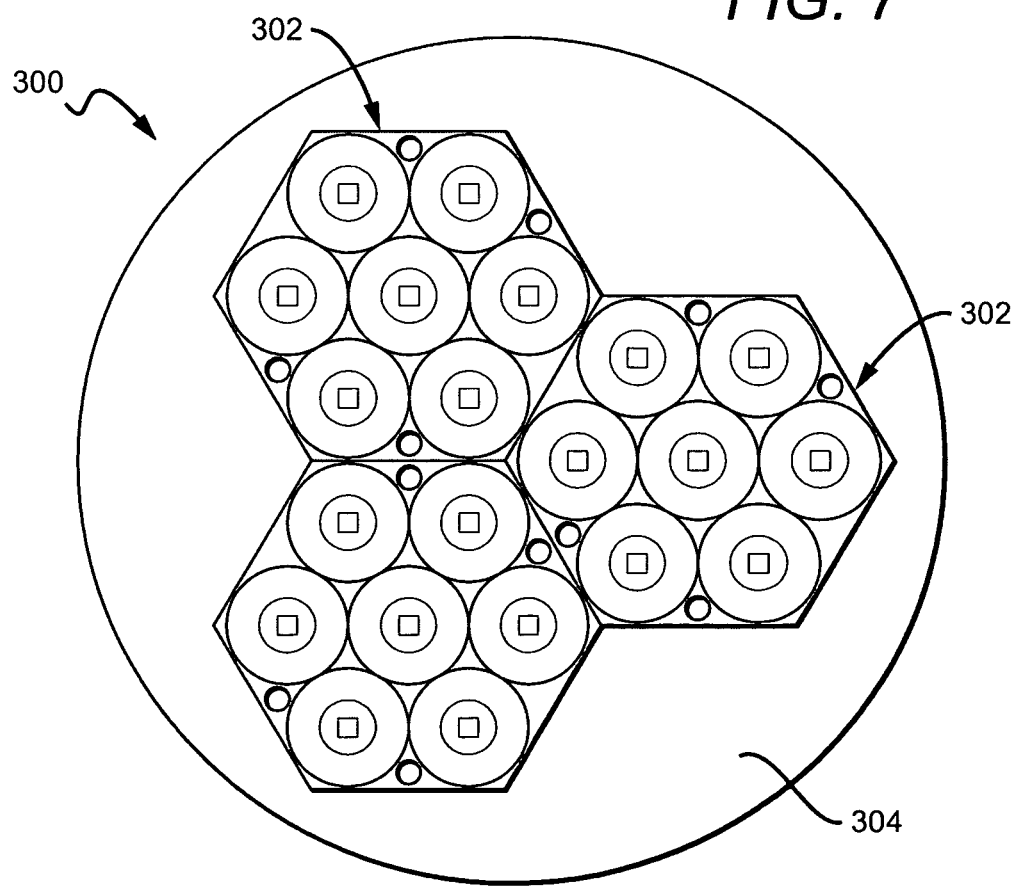
FIG. 7 is a plan view of one embodiment of a light source utilizing arrays according to the present invention.

As described above, the arrays can be connected together for use in many different applications. FIG. 7 shows one embodiment of a light source 300 comprising luminaries 302 that are similar to those described above and shown in FIGS. 5a through 5f. Jumpers (not shown) can be included between contact pads of adjacent arrays 302, so that an electrical signal applied the first of the arrays 302 is conducted to the others. The interconnected arrays 302 are preferably mounted to a surface 304 that can also serve as a heat sink to draw heat away from the arrays.

Figure 8:
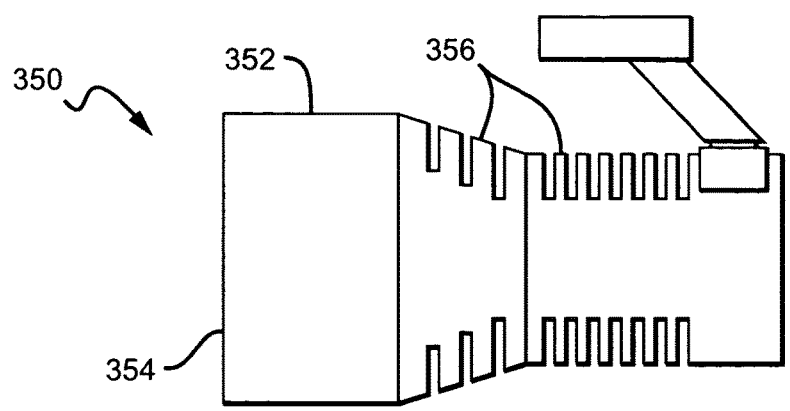
FIG. 8 is one embodiment of a lamp that can utilize arrays according to the present invention.

The light source 300 can be used in many different lighting applications, with one being the light source for a lamp. FIG. 8 shows one embodiment of a lamp 350 that can use the light source 300 and other array based light sources. The light source 300 is arranged within the lamp housing 352 so that light emits out through the housing opening 354. The opening 354 can have a cover to protect the light source 300 or an opening optical element to both protect the light source and shape the emitting light. It is also noted that the housing 352 can have heat dissipating fins 356 to help dissipate the heat from the light source 300.

The light source 300 can be arranged to emit many different colors of light with different intensities. Different LEDs can be used on the arrays 302 for different colors and temperatures of light. In one embodiment the light source can emit 1000 lumens or more. In embodiments having LEDs emitting cool white light, the light source 300 emits at 4000 to 10,000 correlated color temperature (CCT). In embodiments where the arrays have LEDs emitting warm white light, the light source 300 emits at 2700 to 4000K CCT. The white light source can also have a color rendering index of 80 or greater. The lamp 350 can also be provided with an integrated power supply that allows it to operate with an efficiency of 90 lumens per Watt or greater.

Figure 9:
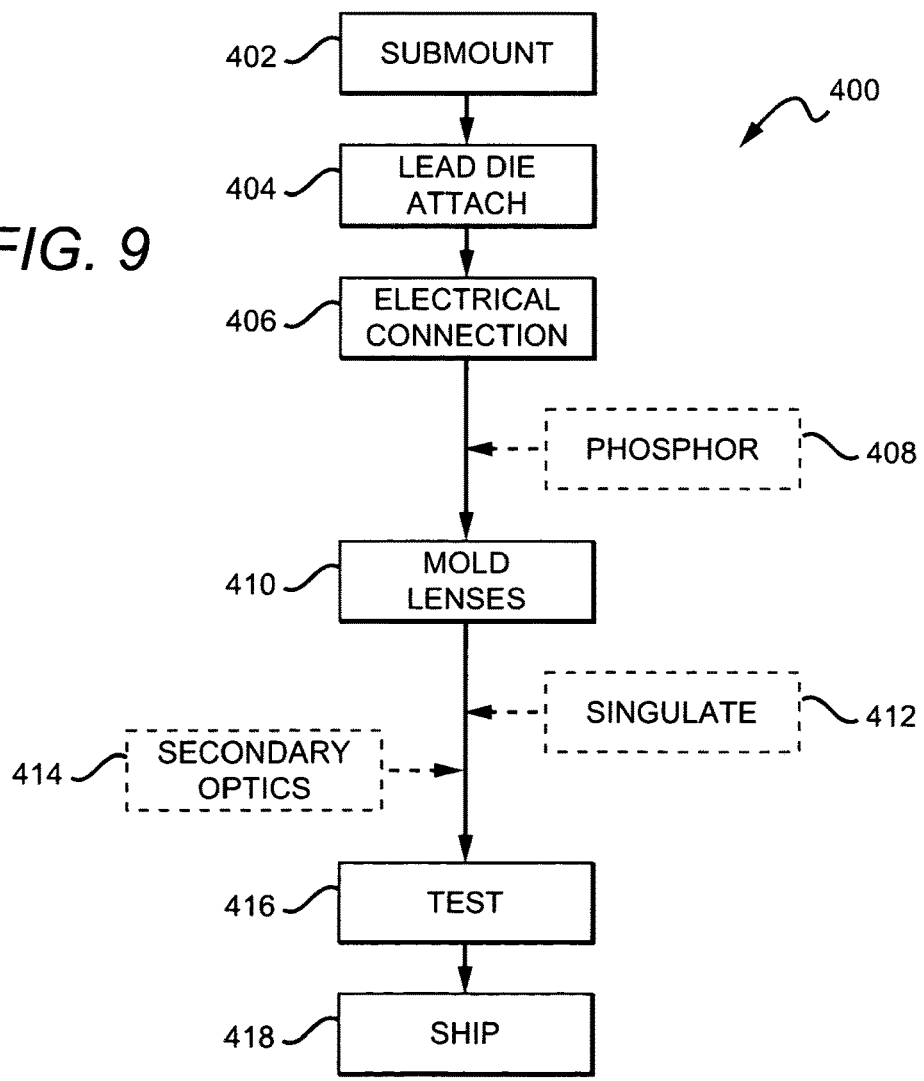
FIG. 9 is a flow diagram of one embodiment of a method of fabricating a light emitting device or array according to the present invention.

The present invention also provides for methods of fabricating arrays and FIG. 9 shows one embodiment of an LED package fabrication method 400 according to the present invention. In 402 a substrate (submount) is provided that can have many different shapes but is preferably hexagon shaped, and sized to serve as the submount for a single array. Alternatively, a submount panel can be provided sized so that it can be diced in subsequent manufacturing steps to provide a plurality of individual submounts. This allows for simultaneous fabrication of a plurality of packages. It is understood that a separate processing step is required for providing the conductive features either for the individual submount or for the panel. These features can include the attach pad, traces, contact pads and metalized are, some of which can be arranged to assist in dissipating heat generated by the LED as described above. The panel comprises a plurality of these features arranged in sets, each of the sets corresponding to one of the plurality of arrays to be formed from the panel.

In 404 a plurality of LEDs are provided each of which is to be die attached to a respective one of the attach pads. In one embodiment, the plurality of LEDs comprise white emitting LEDs chips, and many different white chips can be used with a suitable white chip being described in the patent applications mentioned above and incorporated herein. In other embodiments more than one LED can be provided for mounting to each of the attach pads. In this step a plurality of ESD protection elements can also be provided, each of which can be mounted in conjunction with one of the attach pads to provide ESD protection for the LEDs. Many different mounting methods and materials can be used, such as mounting using conventional solder materials and methods. In this step each of the ESD elements can also be mounted to a respective attach pad using the same mounting method and material. It is understood that the ESD element can also be mounted in other locations using other methods.

In 406 electrical connections are formed between each of the LEDs on the attach pads and one of the adjacent traces so that the LEDs are connected in series between the attach pads. In this step the ESD element can also be connected to the respective trace. Wire bond connections can be formed using known processes and can be made of known conductive materials such as gold. It is understood that flip-chip bonded LED or ESD elements with co-planar contacts to their respective electrodes can also be used as an alternative method for connecting the devices to the traces. Other methods include eutectic attach and solder attach processes.

In some embodiments the LEDs can be provided and mounted to the panel without the desired white light conversion material. In these embodiments the conversion material can be deposited on the LED after wire bonding. In optional 408 the conversion material or phosphor is deposited on the LED, and many different known phosphor deposition methods can be used such as electrophoretic deposition (EPD), with a suitable EPD process described in the patent application mentioned above.

In 410 the first encapsulant is formed over the LEDs by molding over each of the LEDs and many different molding methods can be used. In one embodiment a molding process is used that simultaneously forms lenses over the LEDs submount (or submount panel). One such molding process is referred to as compression molding processes wherein a mold is provided having a plurality of cavities each of which has an inverted shape of the lens. Each cavity is arranged to align with a respective one of the LEDs on a submount. The mold is loaded with a lens material in liquid form filling the cavities, with the preferred material being liquid curable silicone. The submount is inverted and moved toward the cavity with each of the LEDs being embedded in the liquid silicone within one a respective one of the cavities. In one embodiment a layer of silicone can also remain between adjacent lenses that provides a protective layer over the top surface of the submount. The liquid silicone can then be cured using known curing processes. The submount can then be removed from the mold and the submount can comprise a plurality of molded lenses, each of which is over a respective one of the LEDs.

It is understood that other methods can be used for forming lenses according to the present invention. In one alternative method, the lenses can be formed over the LEDs using known dispensing processing and then cured.

For those embodiments of the method 400 utilizing a submount panel, optional 412 can be utilized to singulate the submount panel into individual arrays. In optional 414 an optical element can be mounted over the lenses in the form of secondary optics. These optics can be made of the materials described above, can be fabricated using the methods described above, and can be mounted over the lenses using known methods and materials. In 416 each of the arrays can be tested to be sure they are operating correctly and to measure each device output light characteristics. In 418 the LED packages can be shipped to the customer.

In embodiments where the submounts are provided in a panel, the panel can be diced/singulated to separate the individual arrays and different methods can be used such as known saw singulation methods. When using this method a tape can be attached to the panel prior to singulation to hold and stabilize the panel and individual arrays. Following singulation, the arrays can be cleaned and dried.

Although the present invention has been described in detail with reference to certain preferred configurations thereof, other versions are possible. Therefore, the spirit and scope of the invention should not be limited to the versions described above.

We claim:

1. An emitter array, comprising:
    a submount comprising at least one of a PCB, a FR-4 PCB, or a metal core PCB, said submount further comprising a top surface, a plurality of edges, and conductive features;
    said conductive features comprising input and output terminals, a plurality of attach pads, and a plurality of electrical traces distinct from said input and output terminals, wherein at least some of said conductive features are on a portion of said top surface of said submount;
    said input and output terminals on said top surface of said submount, wherein each of said input and output terminals extend continuously proximate to and along more than one edge of said plurality of edges, providing access to said terminals from more than one edge of said plurality of edges;
    a plurality of solid state emitters, at least one of said solid state emitters flip-chip bonded to at least one attach pad on said submount top surface, said attach pads covering more of said submount top surface than said solid state emitters and configured to conduct heat from said one of said plurality of solid state emitters to the top surface of said submount, wherein said submount is configured to conduct heat from said top surface through said submount;
    said plurality of electrical traces on said top surface of said submount configured to connect said plurality of solid state emitters with said input and output terminals, such that an electrical path from said input terminal to said output terminal through said plurality of solid state emitters is on or above said top surface; and
    a plurality of lenses, each lens in the plurality of lenses over a respective one of said attach pads and covering said at least one of said solid state emitters attached to said respective one of said attach pads, wherein said plurality of lenses are on said top surface of said, wherein said emitter array further comprises secondary optics over at least some of said plurality of lenses, said secondary optics integrated into a single assembly submount.

2. The array of claim 1, wherein said solid state emitters comprise light emitting diodes (LEDs).

3. The array of claim 2, wherein said attach pads extend radially on said top surface of said submount from an edge of at least one of said plurality of solid state emitters.

4. The array of claim 1, wherein said attach pads extend on said top surface of said submount from an edge of at least one of said plurality of solid state emitters.

5. The array of claim 1, wherein said substrate is polygonal.

6. The array of claim 1, said input terminal further comprising a first set of contact pads proximate to a corresponding plurality of said edges.

7. The array of claim 6, wherein said input and output terminals further comprise a second set of contact pads proximate to a corresponding plurality of said edges opposite said first set of contact pads.

8. The array of claim 1, wherein said electrical traces connect said solid state emitters and said attach pads in series between said input and output terminals.

9. The array of claim 1, further comprising a heat spreader on a bottom surface of said submount.

10. The array of claim 1, wherein each of said attach pads in said plurality of attach pads is adjacent to at least one of said plurality of traces.

11. The array of claim 1, wherein at least one pair of said attach pads in said plurality of attach pads is connected by one of said plurality of traces.

12. The array of claim 1, wherein said input terminal is coupled to a first trace of said plurality of traces, said first trace coupled to a first attach pad of said plurality of attach pads.

13. The array of claim 1, wherein said output terminal is coupled to a second trace of said plurality of traces, said second trace coupled to a second attach pad of said plurality of attach pads.

14. The array of claim 1, wherein the electrical path is entirely on or above said top surface of said submount.

15. The emitter array of claim 1, further comprising secondary optics over at least some of said plurality of lenses.

16. The emitter array of claim 15, wherein said secondary optics are dome-shaped.

17. The emitter array of claim 15, wherein said secondary optics are integrated into a single assembly.

18. The emitter array of claim 1, wherein said plurality of lenses are dome-shaped.

19. A light emitting diode (LED) array, comprising:
a submount comprising at least one of a PCB, a FR-4 PCB, or a metal core PCB, said submount further comprising a top surface, a bottom surface, at least six edges, and conductive features;
said conductive features comprising input and output terminals, a plurality of thermally conductive elements, and a plurality of electrical traces distinct from said input and output terminals, wherein at least some of said conductive features are on a portion of said top surface of said submount;
said input and output terminals on said top surface, said input terminal proximate to, but set back from, at least first, second, and third edges of said submount, and said output terminal proximate to, but set back from, at least fourth, fifth, and sixth edges of said submount, wherein each of said first, second, and third edges is opposite one of said fourth, fifth, and sixth edges;
said plurality of thermally conductive elements on said top surface, said plurality of thermally conductive elements comprising a plurality of attach pads; and
a plurality of LEDs, each LED mounted on one of said attach pads on said submount top surface, said attach pads covering more of said submount top surface than said plurality of LEDs, an electrical signal applied to said input and output terminals causing said plurality of LEDs to emit light, at least some of said thermally conductive elements configured to conduct heat from said plurality of LEDs top surface of said submount, wherein said submount is configured to conduct heat from said top surface through said submount;
wherein said plurality of LEDs are configured such that an electrical path from said input terminal to said output terminal is conveyed via said electrical traces through said plurality of LEDs, said electrical traces being on or above said top surface of said submount; and
a plurality of lenses, each lens in the plurality of lenses over a respective one of said attach pads and covering said at least one of said LEDs attached to said respective one of said attach pads, wherein said plurality of lenses are on said top surface of said wherein said LED array further comprises secondary optics over at least some of said plurality of lenses submount.

20. The array of claim 19, wherein said submount is hexagonal.

21. The array of claim 19, wherein said conductive elements comprise:
a plurality of traces on or above said top surface of said submount;
wherein each LED is attached to one attach pad of the plurality of attach pads, and wherein each attach pad of said plurality of attach pads is connected with at least one of said traces.

22. The array of claim 21, wherein each attach pad of said plurality of attach pads is adjacent to at least one of said plurality of traces.

23. The array of claim 21, wherein at least one pair of attach pads of said plurality of attach pads is connected by one of said plurality of traces.

24. The array of claim 21, wherein said input terminal is coupled to a first trace of said plurality of traces, said first trace coupled to a first attach pad of said plurality of attach pads.

25. The array of claim 21, wherein said output terminal is coupled to a second trace of said plurality of traces, said second trace coupled to a second attach pad of said plurality of attach pads.

26. The array of claim 19, further comprising a heat spreader on said submount.

27. The array of claim 19, further comprising secondary optics over at least some of said plurality of lenses.

28. A lamp, comprising:
a lamp body comprising an opening; and
a light source within said body to radiate light through said opening, said light source comprising at least one array, each said array comprising:
a submount comprising at least one of a PCB, a FR-4 PCB, or a metal core PCB, said submount further comprising a top surface, at least six edges, and conductive features;

said conductive features comprising input and output terminals, a plurality of conductive elements, and a plurality of electrical traces distinct from said input and output terminals, wherein at least some of said conductive features are on a portion of said top surface of said submount;

said input and output terminals on a top surface of said submount, said terminals electrically connected to a network, said input terminal along and accessible from at least first, second, and third edges of said submount, and said output terminal along and accessible from at least fourth, fifth, and sixth edges of said submount, wherein each of said first, second, and third edges is opposite one of said fourth, fifth, and sixth edges of said submount;

said plurality of conductive elements comprising a plurality of attach pads; and a plurality of LEDs at least one of which is attached to at least one attach pad, said conductive elements configured to transfer heat from said LEDs to said top surface of said submount, wherein said attach pads cover more of said submount than said LEDs, wherein said submount is configured to conduct heat from said top surface through said submount;

wherein said plurality of conductive elements are configured such that an electrical path from said input terminal to said output terminal travels through said plurality of LEDs via said electrical traces, said electrical traces being on or above said top surface of said submount; and a plurality of lenses, each lens in the plurality of lenses over a respective one of said attach pads and covering said at least one of said LEDs attached to said respective one of said attach pads, wherein said plurality of lenses are on said top surface of said wherein said lamp further comprises secondary optics over at least some of said plurality of lenses submount.

29. The lamp of claim 28, wherein said at least one array comprises a plurality of arrays in an expandable tiling on a surface within said body and further comprising a network of conductors connected to provide power to said arrays.

30. The lamp of claim 29, wherein said surface is thermally conductively coupled to a heat sink.

31. The lamp of claim 28, wherein each LED is attached to one of the plurality of attach pads, and wherein each attach pad of said plurality of attach pads is directly connected with at least one of said plurality of traces.

32. The lamp of claim 31, wherein each attach pad of said plurality of attach pads is adjacent to at least one of said plurality of traces.

33. The lamp of claim 31, wherein at least one pair of attach pads in said plurality of attach pads is directly connected by one of said plurality of traces.

34. The lamp of claim 31, wherein said input terminal is coupled to a first trace of said plurality of traces, said first trace coupled to a first attach pad of said plurality of attach pads.

35. The lamp of claim 31, wherein said output terminal is coupled to a second trace of said plurality of traces, said second trace coupled to a second attach pad of said plurality of attach pads.

36. The lamp of claim 28, further comprising secondary optics over at least some of said plurality of lenses.

37. A method for fabricating an emitter array, comprising:

forming conductive features on a surface of a submount, said conductive features comprising attach pads and input and output terminals, each of said input and output terminals extending continuously proximate to and along more than one side of said submount, and a plurality of electrical traces narrower than said attach pads and distinct from said input and output terminals;

providing access to said input and output terminals from more than one side of said submount;

attaching by mounting a plurality of LEDs to said attach pads such that said plurality of LEDs are electrically connected by said plurality of conductive features through said electrical traces, said plurality of conductive features configured to spread heat from said plurality of LEDs into at least a portion of said submount, wherein said attach pads cover more of said surface of said submount than said LEDs;

providing a plurality of lenses, each lens in the plurality of lenses over a respective one of said attach pads and covering said at least one of said LEDs attached to said respective one of said attach pads, wherein said plurality of lenses are on said surface of said; and mounting secondary optics over said plurality of lenses submount.

38. The method of claim 37 further comprising depositing a solder mask partially over said conductive features.

39. The method of claim 37, wherein said forming said sets of conductive features comprises forming a plurality of traces on or above said top surface of said submount and wherein each of said attach pads is connected with at least one of said traces.

40. The method of claim 39, wherein each of said attach pads is adjacent to at least one of said plurality of traces.

41. The method of claim 39, wherein at least one pair of said attach pads is directly connected by one of said plurality of traces.

42. The method of claim 39, further comprising:

forming an input terminal on or above said submount wherein said plurality of traces comprises a first trace coupled to said input terminal, said first trace coupled to a first attach pad of said plurality of attach pads.

43. The method of claim 39, further comprising:

forming an output terminal on or above said submount, wherein said plurality of traces comprises a second trace coupled to said output terminal, said second trace coupled to a second attach pad of said plurality of attach pads.

44. The method of claim 37, further comprising disposing a heat spreader on said submount.

45. The method of claim 37, further comprising mounting secondary optics over said plurality of lenses.

46. A method for fabricating a plurality of arrays, comprising:

forming sets of attach pads and contact pads and electrical traces on a submount panel sized to accommodate a plurality of arrays, said electrical traces narrower than said attach pads and distinct from said contact pads, with each of said sets corresponding to one array in said plurality of arrays, each of said contact pads extending continuously proximate to, but set back from, more than one side of said submount panel, providing access to said contact pads from more than one side of said submount panel, said traces on or above a top surface of said submount panel;

attaching by mounting a plurality of LEDs to said submount panel such that an electrical path runs through said LEDs via said electrical traces, said electrical traces being on or above the top surface of said submount, at least one LED of said plurality of LEDs attached to one attach pad of said attach pads, said attach pads covering more of said submount panel than said LEDs and conducting heat from said plurality of LEDs to said submount;

providing a plurality of lenses, each lens in the plurality of lenses over a respective one of said attach pads and covering said at least one of said LEDs attached to said respective one of said attach pads, wherein said plurality of lenses are on said top surface of said submount panel; and singulating said submount panel to separate it into a plurality of arrays each of which comprises a plurality of LED electrically connected so that a signal applied to one of said contact pads is conducted to illuminate the LEDs on the particular array.

47. The method of claim 46, wherein each of said attach pads is adjacent to at least one of said plurality of traces.

48. The method of claim 46, wherein at least one pair of said attach pads is directly connected by one of said plurality of traces.

49. The method of claim 46, further comprising:

forming an input terminal on or above said submount, wherein said plurality of traces comprises a first trace coupled to said input terminal, said first trace coupled to a first attach pad of said plurality of attach pads.

50. The method of claim 46, further comprising:

forming an output terminal on or above said submount, wherein said plurality of traces comprises a second trace coupled to said output terminal, said second trace coupled to a second attach pad of said plurality of attach pads.

51. The method of claim 46 wherein said electrical path is entirely on or above said top surface of said submount.

52. The method of claim 46, further comprising disposing a heat spreader on said submount.

* * * * *